(12) United States Patent
Kim

(10) Patent No.: US 6,950,045 B2
(45) Date of Patent: Sep. 27, 2005

(54) GAMMA CORRECTION D/A CONVERTER, SOURCE DRIVER INTEGRATED CIRCUIT AND DISPLAY HAVING THE SAME AND D/A CONVERTING METHOD USING GAMMA CORRECTION

(75) Inventor: Kyung-Myun Kim, Mapo-gu (KR)

(73) Assignee: Samsung Electronics Co., ltd., (KR)

( * ) Notice: Subject to any disclaimer, the term of this patent is extended or adjusted under 35 U.S.C. 154(b) by 0 days.

(21) Appl. No.: 10/999,634

(22) Filed: Nov. 30, 2004

(65) Prior Publication Data

US 2005/0128113 A1    Jun. 16, 2005

(30) Foreign Application Priority Data

Dec. 12, 2003   (KR) ...................... 10-2003-0090725

(51) Int. Cl.[7] .......................... H03M 1/06; G09G 3/36
(52) U.S. Cl. .................. 341/118; 341/144; 345/89; 345/98
(58) Field of Search ................ 341/118, 144, 159; 345/89, 98, 590

(56) References Cited

U.S. PATENT DOCUMENTS

| | | | | |
|---|---|---|---|---|
| 4,921,334 A | * | 5/1990 | Akodes ........................ 345/89 |
| 5,784,041 A | | 7/1998 | Okada et al. ................. 345/89 |
| 5,828,330 A | * | 10/1998 | Benzel ........................ 341/159 |
| 6,154,121 A | | 11/2000 | Cairns et al. ................. 340/347 |
| 6,272,053 B1 | | 8/2001 | Choi ...................... 365/189.03 |
| 6,437,716 B2 | * | 8/2002 | Nakao ......................... 341/118 |
| 6,593,934 B1 | * | 7/2003 | Yang et al. .................... 345/89 |
| 6,836,232 B2 | * | 12/2004 | Bu .............................. 341/118 |
| 6,879,310 B2 | * | 4/2005 | Nose ........................... 345/89 |

FOREIGN PATENT DOCUMENTS

| | | | |
|---|---|---|---|
| KR | 10-0188016 | 9/1999 | ........... G11C 11/34 |
| KR | 2000-0007310 | 2/2000 | ............ G11C 8/00 |

* cited by examiner

*Primary Examiner*—Lam T. Mai
(74) *Attorney, Agent, or Firm*—Mills & Onello LLP

(57) ABSTRACT

In a gamma correction digital-to-analog converter, one of first gamma correction reference voltage signals is selected as a first corresponding gray scale signal based on lower m+n bits of a k bit digital input signal when upper l bits of the k bit input signal correspond to an upper or lower code set, where k=l+m+n, and where k, l, m and n are integers. A pair of adjacent second gamma correction reference voltage signals is selected from second gamma correction reference voltage signals based on upper l+m bits when the upper l bits correspond to a middle code set, and one is selected from the pair of second gamma correction reference voltage signals and $2^n-1$ divided signals as a second corresponding gray scale signal, the divided signals being obtained by dividing an interval between the selected pair into $2^n$ levels. The first or second gray scale signal is selected to be output.

28 Claims, 16 Drawing Sheets

GAMMA CORRECTION D/A CONVERTER, SOURCE DRIVER INTEGRATED CIRCUIT AND DISPLAY HAVING THE SAME AND D/A CONVERTING METHOD USING GAMMA CORRECTION

BACKGROUND OF THE INVENTION

1. Field of the Invention

The present invention relates to display devices, and more particularly to a gamma correction digital-to-analog (D/A) converter, a source driver integrated circuit, a display device having the gamma correction D/A converter, and a D/A converting method using the gamma correction operation in display devices.

2. Description of the Related Art

Flat panel display (FPD) devices such as a liquid crystal display devices have become widely popular in recent years, effectively replacing cathode ray tube (CRT) type monitors. Such displays are used in notebook computers, desktop monitors and television receivers, allowing for lighter and sleeker designs.

The flat panel display device includes a display panel and a driver circuit. A plurality of switching device is arranged in a matrix shape of the display panel, and the driver circuit including a source driver circuit (or a data driver circuit) and a gate driver circuit (or a scan driver circuit) drives the switching devices. In recent designs, the driver chip in which the driver circuit is embodied is also mounted on the display panel.

A source driver integrated circuit includes a gamma correction D/A converter block. The gamma correction D/A converter block occupies a large area of the source driver integrated circuit. The gamma correction D/A converter block includes a plurality of gamma correction D/A converter units. Each of the gamma correction D/A converter units corresponds to each of the source lines or each of the channels, and each of the gamma correction D/A converter units is electrically connected to n-number of gamma correction reference voltage signal lines, wherein 'n' is determined by a number of gray scale levels. Therefore, the gamma correction D/A converter occupies a large area of the circuit.

The gray scale corresponds to an amount of light perceived by a human. In a liquid crystal display device, the amount of light that transmits through a liquid crystal is adjusted to represent the gray scale.

When an electric field is applied to the liquid crystal, the arrangement of the liquid crystal varies in response to the electric field applied thereto, and thus an optical transmittance thereof can be changed to represent the gray scale. However, the transmittance of the liquid crystal may not be linearly proportional to the voltage applied thereto. In a liquid crystal display device, there may exist a non-linear region corresponding to a white or black color where the transmittance is not linearly varied according to the voltage applied to the liquid crystal and a linear region corresponding to a halftone gray scale where the transmittance is linearly varied according to the voltage applied to the liquid crystal.

Therefore, when the voltage applied to the liquid crystal is quantized to have a regular interval, the transmittance intervals become irregular to thereby cause deterioration of images. Particularly, exquisite gray scale may not be expressed.

In order to prevent the deterioration of images, the interval of transmittance instead of the interval of the pixel voltages needs to be regular. That is, the interval of gray scale voltage needs to be adjusted such that the interval of the gray scale voltages of the non-linear region is larger than the interval of the gray scale voltage of the linear region. This adjustment is referred to as gamma correction.

FIG. 1 is an exemplary gamma correction curve in a digital-to-analog converter for a liquid crystal display device. As shown in FIG. 1, since the relation between the transmittance and the voltage applied to the liquid crystal of an LCD has non-linear regions, a reference voltage of the DAC may have a compensated gamma correction relative to input digital data.

An L-group corresponding to code values $00_H$ to $1F_H$ and an H-group corresponding to code values of $E0_H$ to $FF_H$ correspond to a non-linear region where the code values and the reference voltages have a non-linear relationship. A C-group corresponding to code values of $20_H$ to $DF_H$ corresponds to a linear region where the code values and the reference voltages have a linear relationship, wherein subscript 'H' represents hexadecimal notation. The code values represent gray scale data. Generally, reference signals of the gamma correction are generated by a voltage divider such as a resistor string. Therefore, in case of 8-bit digital data, 256 reference voltage signal lines are required in order to express 256 $(=2^8)$ levels of gray scale.

U.S. Pat. No. 5,784,041 discloses an interpolating technique that reduces the number of the reference voltage signal lines from 256 to 32. In detail, a pair of the reference voltage signal lines is selected from 32 reference voltage signal lines, and an interval of voltages of the selected pair of the reference voltage signal lines is divided into 8 levels, and one of the 8 levels is selected as a voltage to be applied to the pixel electrode.

However, according to U.S. Pat. No. 5,784,041, the total of 256 levels of gray scale are divided into 32 equal levels of gray scales, and each of the 32 equal levels of gray scales is divided into 8 levels. In a middle region of the gamma correction curve, the transmittance and the code values have substantially linear characteristics, however, in both end portions of the gamma correction curve, the transmittance and the code values still have nonlinear characteristics. According to U.S. Pat. No. 5,784,041, the size of the gamma correction circuit is reduced, however, the gamma correction may not be satisfactory due to the non-linear nature of the end regions.

U.S. Pat. No. 6,154,121 discloses a technique that divides the voltage levels of the non-linear regions into many more portions than that of the linear region. However, gamma correction errors are also generated at the nonlinear region corresponding to both sides of the gamma correction curve. In this manner, the gamma correction characteristic has a trade-off relationship with the chip size.

SUMMARY OF THE INVENTION

The present invention provides a D/A converter and a method capable of performing a gamma correction operation in which a size of a gamma correction circuit can be reduced.

The present invention also provides a source driver integrated circuit having the D/A converter.

The present invention also provides a display device having the source driver circuit.

In a first aspect, there is provided a gamma correction digital-to-analog converter. The gamma correction digital-to-analog converter includes a first digital-to-analog conversion circuit, a second digital-to-analog conversion circuit and an output selection circuit.

The first digital-to-analog conversion circuit unit selects one from a plurality of first gamma correction reference voltage signals as a first corresponding gray scale signal based on lower m+n bits of a k bit digital input signal when upper l bits of the k bit digital input signal correspond to an upper or lower code set, wherein k is equal to l+m+n, and k, l, m and n are integers. The second digital-to-analog conversion circuit unit selects a pair of adjacent second gamma correction reference voltage signals from a plurality of second gamma correction reference voltage signals based on upper l+m bits when the upper l bits correspond to a middle code set, and selects one from the pair of second gamma correction reference voltage signals and $2^n-1$ divided signals as a second corresponding gray scale signal, the divided signals being obtained by dividing an interval between the selected pair of second gamma correction reference voltage signals into $2^n$ levels. The output selection circuit selects one from the selected first and second gray scale signals to be output.

In another aspect, the gamma correction digital-to-analog converter includes a first digital-to-analog conversion circuit configured to select one from $2 \times 2^{m+n}$ upper and lower gamma correction reference voltage signals based on lower m+n bits of a k bit digital input signal as a first corresponding gray scale signal, when the upper l bits of the k bit digital input signal correspond to an upper or lower code set, wherein k is equal to l+m+n, and l, m and n are integers; and a second digital-to-analog conversion unit configured to select a pair of adjacent second gamma correction reference voltage signals from $1+[\{2^k-(2 \times 2^{m+n})\}/2^n]$ middle gamma correction reference voltage signals based on upper l+m bits when the upper l bits correspond to a middle code set, configured to select one from the selected pair of second gamma correction reference voltage signals and $2^n-1$ divided signals to output as a second corresponding gray scale signal, the $2^n-1$ divided signals being obtained by dividing an interval between the selected pair of second gamma correction reference voltage signals into $2^n$ levels, and configured to output the first corresponding gray scale signal that is selected by the first digital-to-analog conversion circuit when the upper l bits correspond to the upper or lower code set.

In another aspect, there is provided a gamma correction digital-to-analog converting method. In the method, whether upper l bits of a k bit digital input signal correspond to an upper code set or a lower code set is discriminated, wherein k is equal to l+m+n, and l, m and n are integers. One is selected from $2 \times 2^{m+n}$ upper and lower gamma correction reference voltage signals based on lower m+n bits of the k bit digital input signal as a first corresponding gray scale signal when the upper l bits correspond to the upper or lower code set. A pair of adjacent second gamma correction reference voltage signals is selected from $1+[\{2^k-(2 \times 2^{m+n})\}/2^n]$ middle gamma correction reference voltage signals based on upper l+n bits when the upper l bits correspond to a middle code set. One is selected as a second corresponding gray scale signal from the pair of second gamma correction reference voltage signals and $2^n-1$ divided signals obtained by dividing an interval between the pair of second gamma correction reference voltage signals into $2^n$ levels. The selected first or second gray scale signal is selectively outputted.

In another aspect, there is provided a source driver integrated circuit. The source driver integrated circuit includes an input circuit, a p-channel gamma correction digital-to-analog converter and a p channel output buffer. The input circuit receives a k-bit digital data stream, being synchronized with a pixel clock, and parallel outputs p k-bit digital data or parallel outputs odd numbered k bit digital data and even numbered k bit digital data alternately in response to a polarity control signal, wherein k is equal to l+m+n, and p, k, l, m and n are integers. The p-channel gamma correction digital-to-analog converter respectively generates a corresponding positive gray scale signal among $2^k$ gray scale values in odd numbered channels and generates a corresponding negative gray scale signal among $2^k$ gray scale values in even numbered channels based on the parallel output k-bit data, wherein each of the positive and negative gray scale signals is selected from a plurality of first gamma correction reference voltage signals corresponding to lower m+n bits of the k-bit digital data when the k-bit digital data corresponds to an upper or a lower code set, and each of the positive and negative gray scale signals is selected from a pair of adjacent second gamma correction reference voltage signals or from $2^n-1$ divided signals obtained by dividing an interval between the pair of second gamma correction reference voltage signals by $2^n$ based on upper l+m bits when the k-bit digital data corresponds to a middle code set. The p channel output buffer outputs the positive or negative gray scale signal in response to the polarity control signal.

In another aspect, there is provided a display device. The display device includes a display cell array, a scan driver and a source driver. The display cell array has a plurality of display cells formed on a region defined by a plurality of source lines and a plurality of gate lines. The scan driver scans the gate lines in sequence. The source driver provides the source lines with corresponding gray scale signals, wherein the source driver includes at least one source drive integrated circuit. Each of the source driver integrating circuit includes an input unit configured to receive k bit digital data stream, being synchronized with a pixel clock, and configured to output p number of k bit digital data in response to a polarity control signal in parallel or alternately output odd numbered k bit digital data and even numbered k bit digital data in parallel; a p-channel gamma correction digital-to-analog converter configured to generate a corresponding positive gray scale signal among $2^k$ gray scale values in odd numbered channels and generate a corresponding negative gray scale signal among $2^k$ gray scale values in even numbered channels based on the parallel data, wherein each of the gray scale signals is one of a plurality of first gamma correction reference voltage signals based on lower m+n bits of the k bit digital input signal when the k bit digital input signal corresponds to upper or lower code set, and each of the gray scale signals is one of a pair of adjacent second gamma correction reference voltage signals selected from a plurality of second middle gamma correction reference voltage signals and $2^n-1$ divided signals obtained by dividing an interval of voltages the pair of second gamma correction reference voltage signals by $2^n$, based on upper l+m bits when the upper l bits correspond to a middle code set; and a p channel output buffer configured to output the positive or negative gray scale signals of the respective channel in response to the polar control signal or alternately output the odd numbered k bit digital data and even numbered k bit digital data.

In the systems and methods of the present invention, an enhanced gamma correction operation can be performed, while reducing the size of the D/A converter.

BRIEF DESCRIPTION OF THE DRAWINGS

The above and other features and advantage points of the present invention will become more apparent by describing in detailed exemplary embodiments thereof with reference to the accompanying drawings.

DETAILED DESCRIPTION OF THE EXEMPLARY EMBODIMENTS

Figure 1:
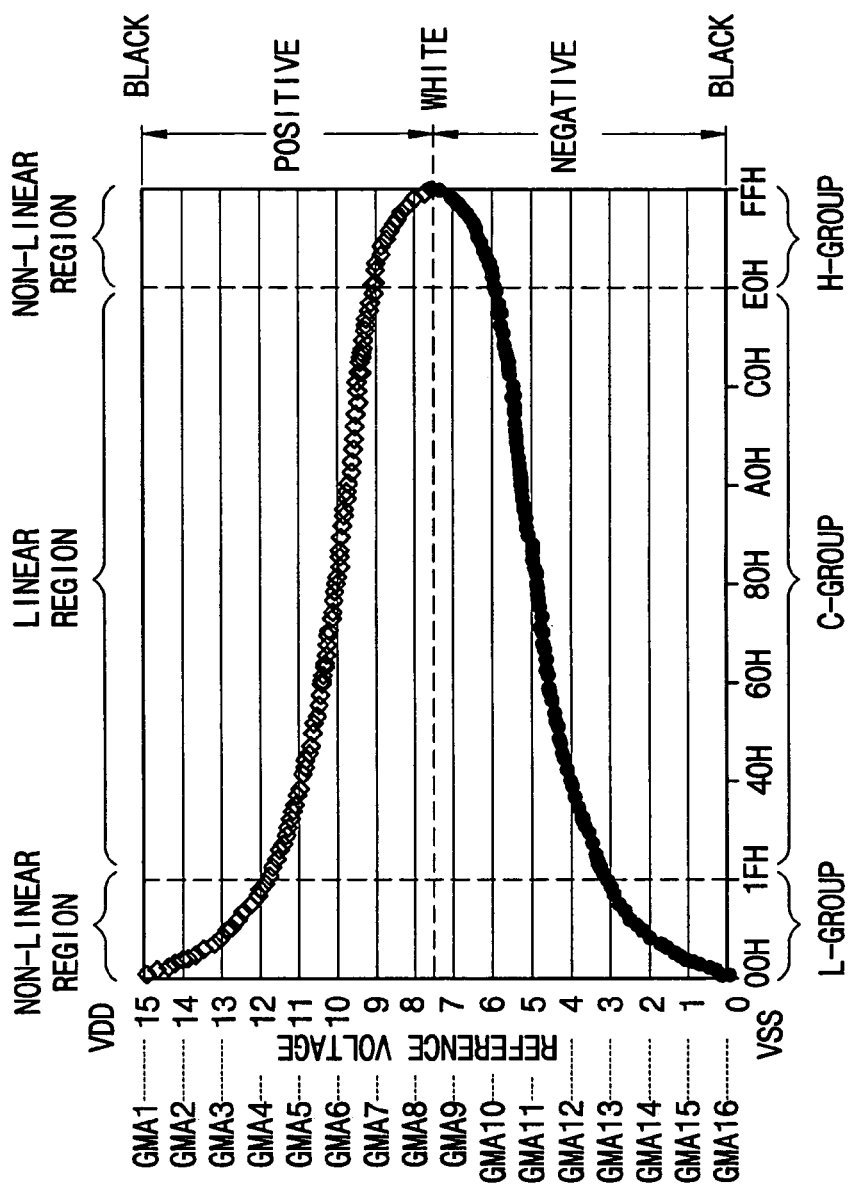
FIG. 1 is an exemplary gamma correction curve in a digital-to-analog converter for a liquid crystal display device.

Hereinafter, the exemplary embodiments of the present invention will be described in detail with reference to the accompanied drawings.

According to the present invention, $2^k$ code values of k bit digital data is divided into $2^l$ code sets, wherein k is equal to l+m+n, and k, l, m and n are integers. The highest level code set (referred to as 'upper code set') and the lowest level code set (referred to as 'lower code set') among the divided $2^l$ code sets correspond to the non-linear regions of the gamma correction curve. Other code sets (referred to as 'middle code set') correspond to the linear region in the middle region of the gamma correction curve. For example, when 3-to-8 weighted digital-to-analog converter is used and 256 grayscales are expressed using 8 bit digital data (that is, k is equal to 8), 1 may be equal to 3, m may be equal to 2 and n may be equal to 3. Therefore, gamma correction reference voltage signals for the upper and lower code sets are 64 in number and gamma correction reference voltage signals for the middle code set are 24 in number.

For example, when 512 grayscales are expressed using 9 bit digital data (that is, k is equal to 9), and assuming that l is equal to 3, m is equal to 3 and n is equal to 3, gamma correction reference voltage signals for the upper and lower code sets are 128 in number and gamma correction reference voltage signals for the middle code set are 48 in number.

In another example, when 1024 grayscales are expressed using 10 bit digital data (that is, k is equal to 10), and assuming that l is equal to 3, m is equal to 4 and n is equal to 3, gamma correction reference voltage signals for the upper and lower code sets are 256 in number and gamma correction reference voltage signals for the middle code set are 96 in number.

Figure 2:
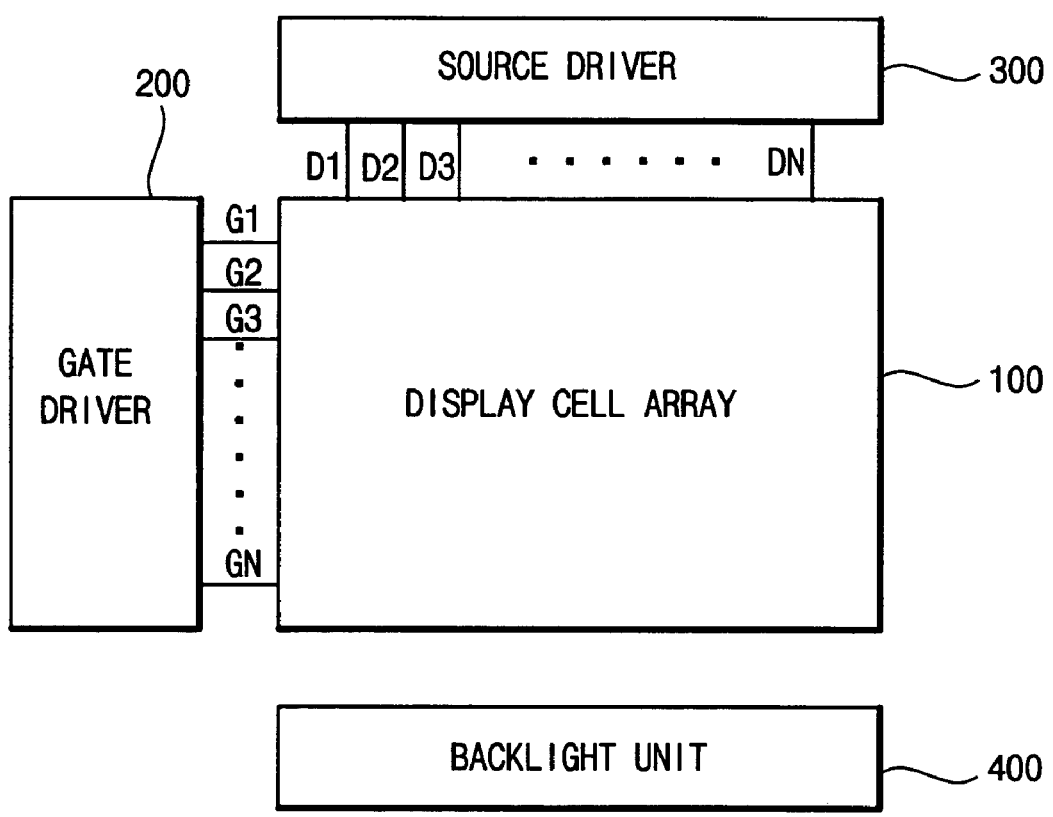
FIG. 2 is a schematic block diagram illustrating a liquid crystal display device according to an exemplary embodiment of the present invention.

FIG. 2 is a schematic block diagram illustrating a liquid crystal display device according to an exemplary embodiment of the present invention.

Referring to FIG. 2, a liquid crystal display device according to an exemplary embodiment of the present invention includes a display cell array 100, a gate driver (or a row driver) 200, a source driver (or a column driver) 300 and a backlight unit 400. When the gate driver 200 selects a gate line G1, G2, G3, ... and GN, the source driver 300 applies a source signal (or a data signal) to a source line D1, D2, D3, ... and DN, so that a thin film transistor (not shown) that is electrically connected to the gate line G1, G2, G3, ... and GN is turned on and the source signal is applied to a pixel electrode of the display cell array 100 through the thin film transistor. Therefore, liquid crystal molecules are rearranged due to electric fields generated between the pixel electrode and a common electrode of the display cell array 100 to display gray scale images.

The source driver 300 includes at least one source driver integrated circuit (IC). The source driver IC receives RGB data and control signals. The source driver IC includes a plurality of output channels (or output terminals) that are electrically connected to the source line D1, D2, D3, ... and DN. For example, the source driver IC includes 480 channels and the source driver IC displays 256 gray scales.

Figure 3:
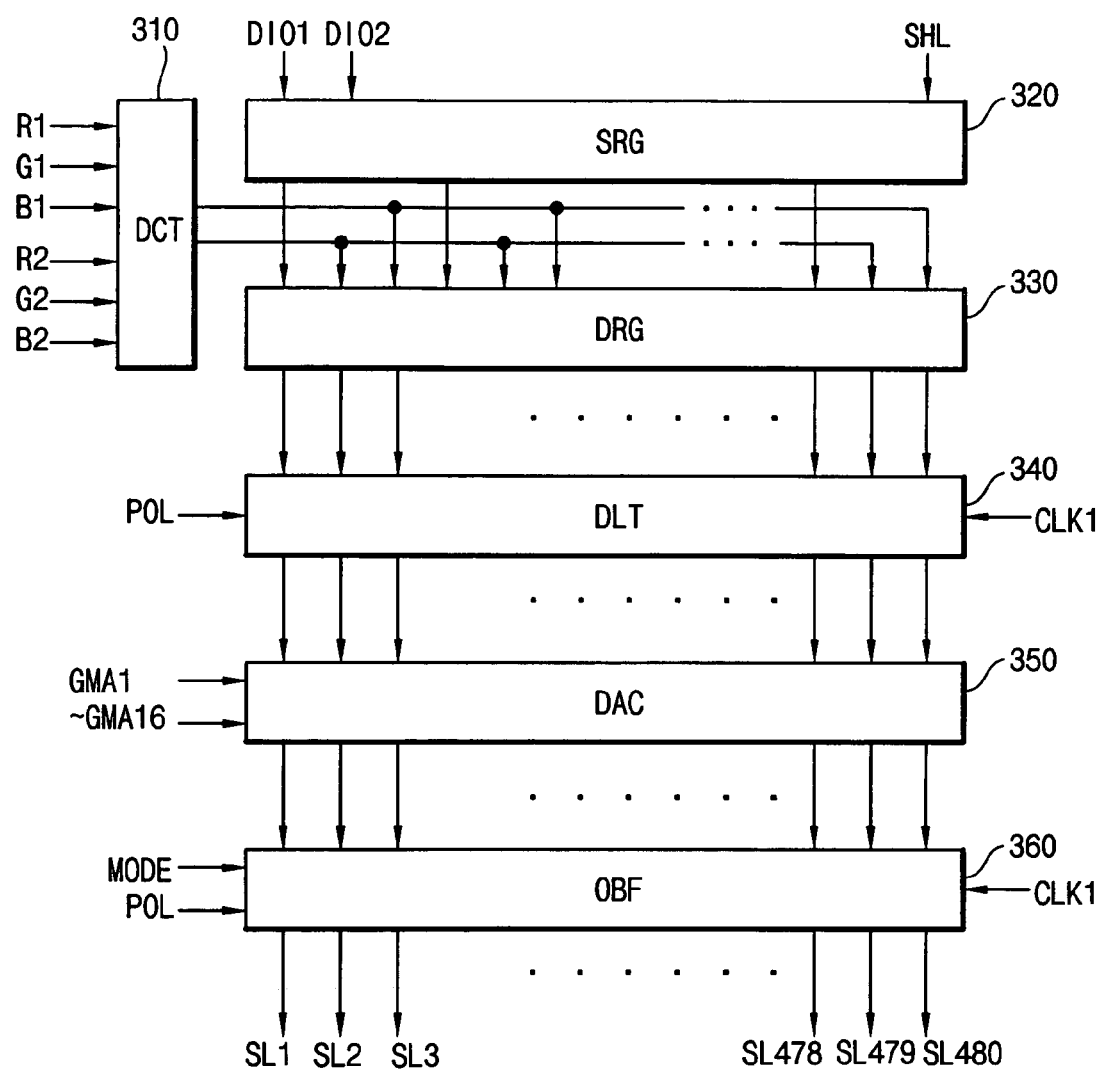
FIG. 3 is a block diagram illustrating a source driver integrated circuit of the source driver in FIG. 2.

FIG. 3 is a block diagram illustrating a source driver integrated circuit of the source driver of FIG. 2.

Referring to FIG. 3, each of source driver ICs includes a data control unit (DCT) 310, a shift register unit (SRG) 320, a data resistor unit (DRG) 330, a data latch unit (DLT) 340, a D/A converting unit (DAC) and an output buffer unit (OBF) 360.

The data control unit 310 receives serial RGB data and converts the serial RGB data into 8-bit parallel data.

The shift register unit 320 receives DI01, DI02 ... and performs a left shift or a right shift on the DI01, DI02 lines ... in response to a shift direction control signal SHL.

The data register unit 330 stores respective 8-bit channel data CHD1~CHD480 corresponding to 480 channels provided from the data control unit 310 or the shift register unit 320.

The data latch unit 340 latches the 8-bit channel data CHD1~CHD480 that is stored in the data register unit 330 in response to pixel clock signals.

The data latch unit 340 outputs even numbered outputs or odd numbered outputs in response to a polarity control signal POL.

The D/A converting unit 350 receives external gamma reference voltage signals GMA1, GMA2, ..., and GMA16, and the D/A converting unit 350 generates 480 analog gray scale signals corresponding to the latched 480 channel data based on the external gamma reference voltage signals GMA1, GMA2, ..., and GMA16.

The output buffer unit 360 applies the 480 analog gray scale signals to 480 source lines SL1 to SL480, respectively.

Figure 4:
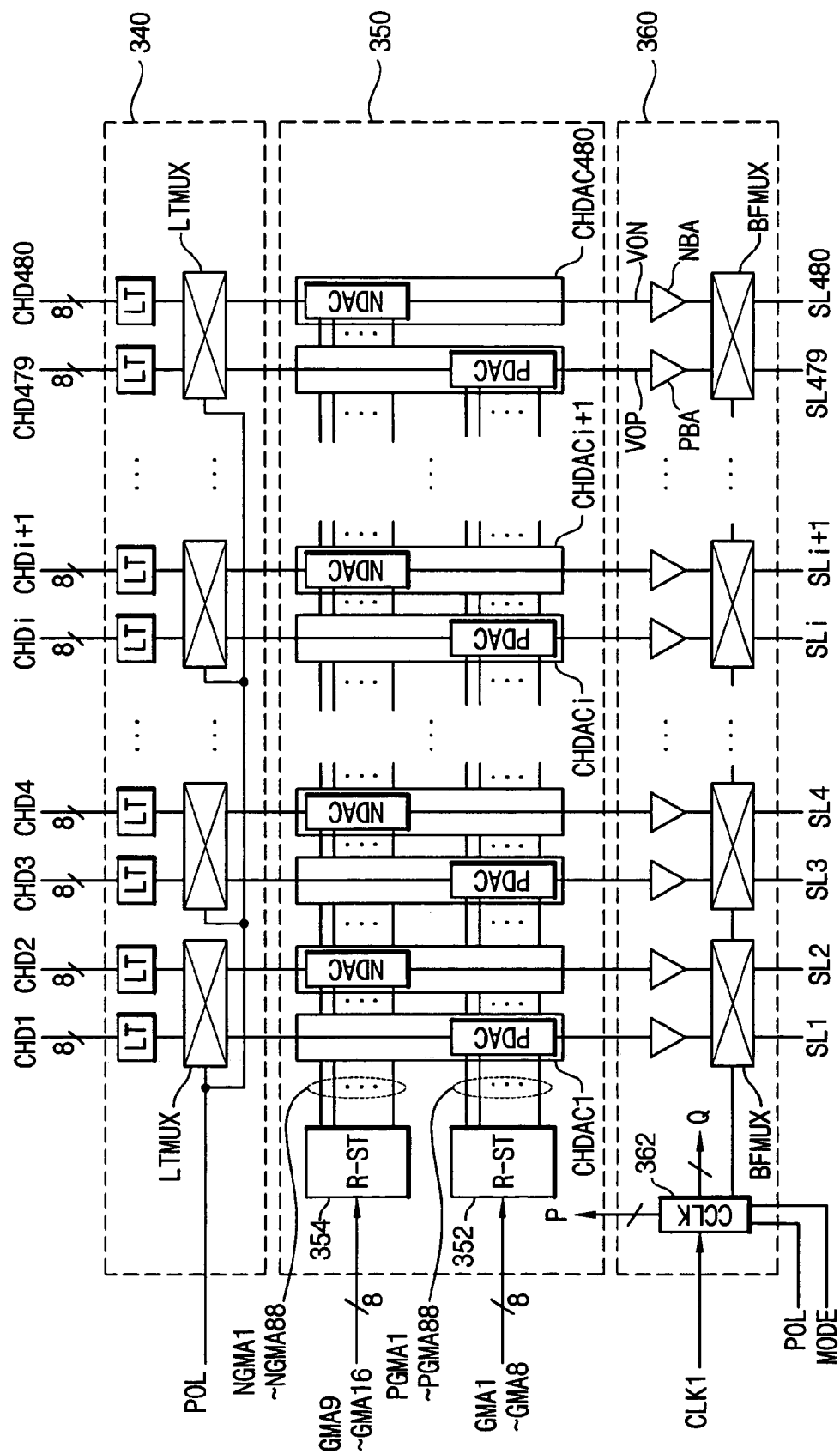
FIG. 4 is a block diagram illustrating a channel structure including a gamma correction D/A converter according to an exemplary embodiment of the present invention.

FIG. 4 is a block diagram illustrating a channel structure including a gamma correction D/A converter according to an exemplary embodiment of the present invention.

Referring to FIG. 4, a data latch unit 340 includes 480 8-bit latches LT and 240 multiplexers LTMUX. Each of multiplexers LTMUX selects output data of an odd numbered latch or an even numbered latch in response to the polarity control signal POL.

A D/A converting unit 350 includes a positive reference voltage generating part 352, a negative reference voltage generating part 354 and 480 channels DAC (CHDAC1, CHDAC2, ..., and CHDAC480).

The positive reference voltage generating part 352 receives 8 external gamma reference voltage signals GMA1 through GMA8 to output 88 internal positive gamma reference voltage signals PGMA1 through PGMA88. The negative reference voltage generating part 354 receives 8 external gamma reference voltage signals GMA9 through GMA16 to output 88 internal negative gamma reference voltage signals NGMA1 through NGMA88. Generally, the positive or negative voltage generating part 352 or 354 divides voltages using a resistor string or a capacitor array to generate a reference voltage.

For example, gamma reference voltage signals PGMA1 through PGMA32, NGMA1 through NGMA32, PGMA57 through PGMA88 and NGMA57 through NGMA88 have variations that are different from one another in order to optimize the non-linear region of the gamma correction curve in FIG. 1, and gamma reference voltage signals PGMA33 through PGMA56, NGMA33 through NGMA56 have equal variations with respect to one another in order to optimize the linear region of the gamma correction curve in FIG. 1.

PGMA1 through PGMA32 or NGMA1 to NGMA32 have a one-to-one correspondence with code values 0 to 31 in the L-GROUP in FIG. 1, and PGMA57 to PGMA88 or NGMA57 to NGMA88 have a one-to-one correspondence with code values 224 to 255 in the H-GROUP in FIG. 1, PGMA33 to PGMA56 or NGMA33 to NGMA56 have a one-to one correspondence with code values in the C-GROUP in FIG. 1 having 24 code values 32, 40, 48, 56, 64, 72, 80, 88, 96, 104, 112, 120, 128, 136, 144, 152, 160, 168, 176, 184, 192, 200, 208 and 216. Odd numbered channel DACs (CHDACi) include the positive DAC (PDAC), and even numbered channel DACs (CHDACi+1) include the negative DAC (NDAC), respectively. The positive DAC (PDAC) is electrically coupled to the PGMA1 to PGMA88 signals, and the negative DAC (NDAC) is electrically coupled to the NGMA1 to NGMA88 signals.

The output buffer unit 360 includes buffer amplifiers PBA corresponding to odd numbered channels and buffer amplifiers NBA corresponding to even numbered channels. The output buffer unit 360 further includes a control clock signal generator CCLK that generates P-control clock signals P1, P1B, P2, P2B, PIP, PIPB, etc. and provides the D/A converting unit 350 with the P-control clock signals, P1, P1B, P2, P2B, PIP, PIPB, etc. Additionally, the control clock signal generator CCLK generates Q-control clock signals Q1, Q1B, Q2, Q2B, Q3, Q3B, Q1P, Q1PB, etc. for controlling the timing of the buffer amplifiers PBA and NBA.

Output pairs of the buffer amplifiers PBA and NBA are switched by the multiplexer BFMUX in response to the polarity control signal POL. That is, when latched data of a first channel is positive and latched data of a second channel is negative, the 8-bit channel data CHD1 is transmitted to PDAC through LTMUX, and the 8-bit channel data CHD2 is transmitted to NDAC through LTMUX. An analog signal VOP, which is generated by PDAC, is transmitted to SL1 through the buffer multiplexer BFMUX, and an analog signal VON, which is generated by NDAC, is transmitted to SL2 through the multiplexer BFMUX.

To the contrary, when the latched data of the first channel is negative and the latched data of the second channel is positive, CHD1 is transmitted to NDAC through LTMUX, and CHD2 is transmitted to PDAC through LTMUX. An analog signal VOP, which is generated by PDAC, is transmitted to SL2 through the multiplexer BFMUX, and an analog signal VON, which is generated by NDAC, is transmitted to SL1 through the multiplexer BFMUX.

1. Pre-Multiplexing Type

<Positive DAC>

Figure 5:
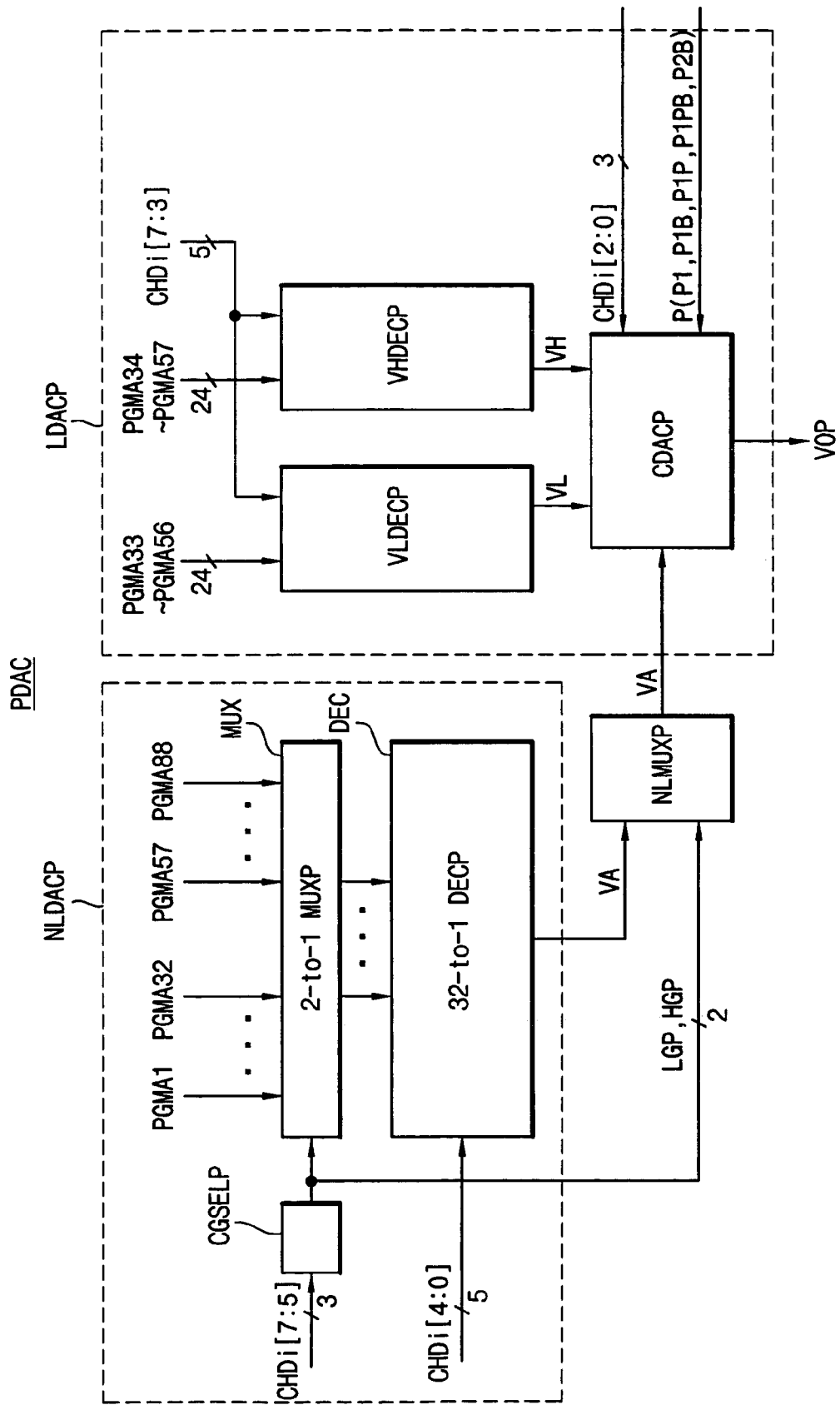
FIG. 5 is a block diagram illustrating the positive D/A converter of FIG. 4 of a pre-multiplexing type according to an exemplary embodiment of the present invention.

FIG. 5 is a block diagram illustrating a positive D/A converter of the pre-multiplexing type.

Referring to FIG. 5, the positive D/A converter PDAC includes a first DAC block NLDACP that corresponds to non-linear regions in both end regions of the gamma correction curve, and a second DAC block LDACP that corresponds to the linear region in the middle region of the gamma correction curve.

The first DAC block NLDACP includes a code set selection unit CGSELP, a multiplexer MUXP, a non-linear multiplexer NLMUXP and a decoder DECP.

The code set selection unit CGSELP receives upper three bits CHDi [7:5] of 8-bit channel data and discriminates whether a code value of the channel data corresponds to a code set corresponding to the non-linear region, thereby generating selection signals HGP and LGP.

Figure 6:
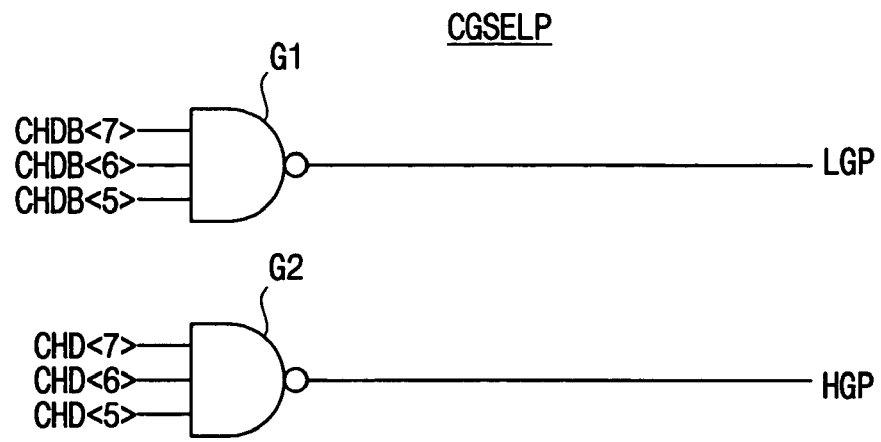
FIG. 6 is a circuit diagram showing the code set selection unit of FIG. 5 according to an exemplary embodiment of the present invention.

FIG. 6 is a circuit diagram showing a code set selection unit of FIG. 5 according to an exemplary embodiment of the present invention.

Referring to FIG. 6, the code set selection unit CGSELP includes a NAND gate G1 and a NAND gate G2.

The NAND gate G1 receives inverted upper three bits CHDBi [7:5], thereby outputting an LGP having a low state when the upper three bits CHDi [7:5] are equal to a binary value "000".

The NAND gate G2 receives inverted the upper three bits CHDi [7:5], thereby outputting an HGP having a low state when the upper three bits CHDi [7:5] are equal to a binary value "111".

Figure 7:
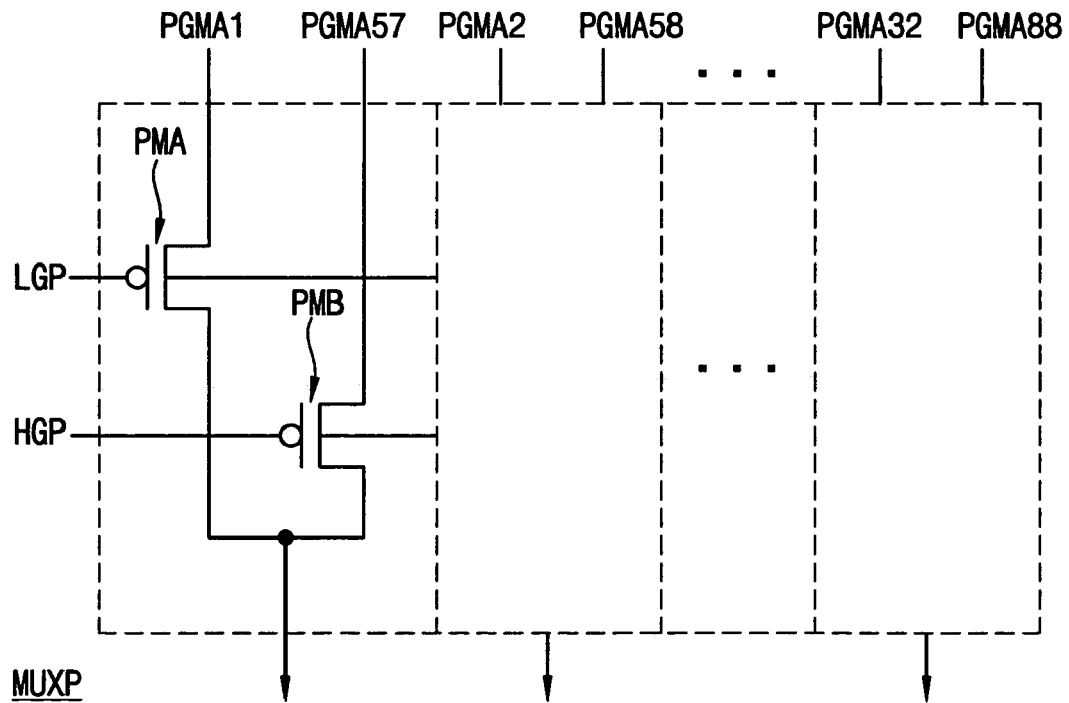
FIG. 7 is a circuit diagram showing the multiplexer of FIG. 5 according to an exemplary embodiment of the present invention.

FIG. 7 is a circuit diagram showing a multiplexer of FIG. 5 according to an exemplary embodiment of the present invention.

Referring to FIG. 7, the multiplexer MUXP receives signals PGMA1 to PGMA32 and PGMA57 to PGMA88 and selects one set therefrom to output the selected set in response to selection signals LGP and HGP. When the LGP has a low state, the PGMA1 to PGMA32 are selected to be output, and when the HGP has a low state, the PGMA57 to PGMA88 are selected to be output.

The multiplexer MUXP includes 32 pairs of PMOS transistors PMA and PMB, the drains of which are commonly coupled each other. The PGMA1 is coupled to a source of the PMA, and the LGP is coupled to a gate thereof. The PGMA2 is coupled to a source of the PMB, and the HGP is coupled to a gate thereof.

The decoder DECP selects one among the selected 32 internal gamma reference voltage signals of MUX based on lower five bits CHDi[4:0] of the channel data, thereby outputting a corresponding analog gray scale signal VA.

Figure 8:
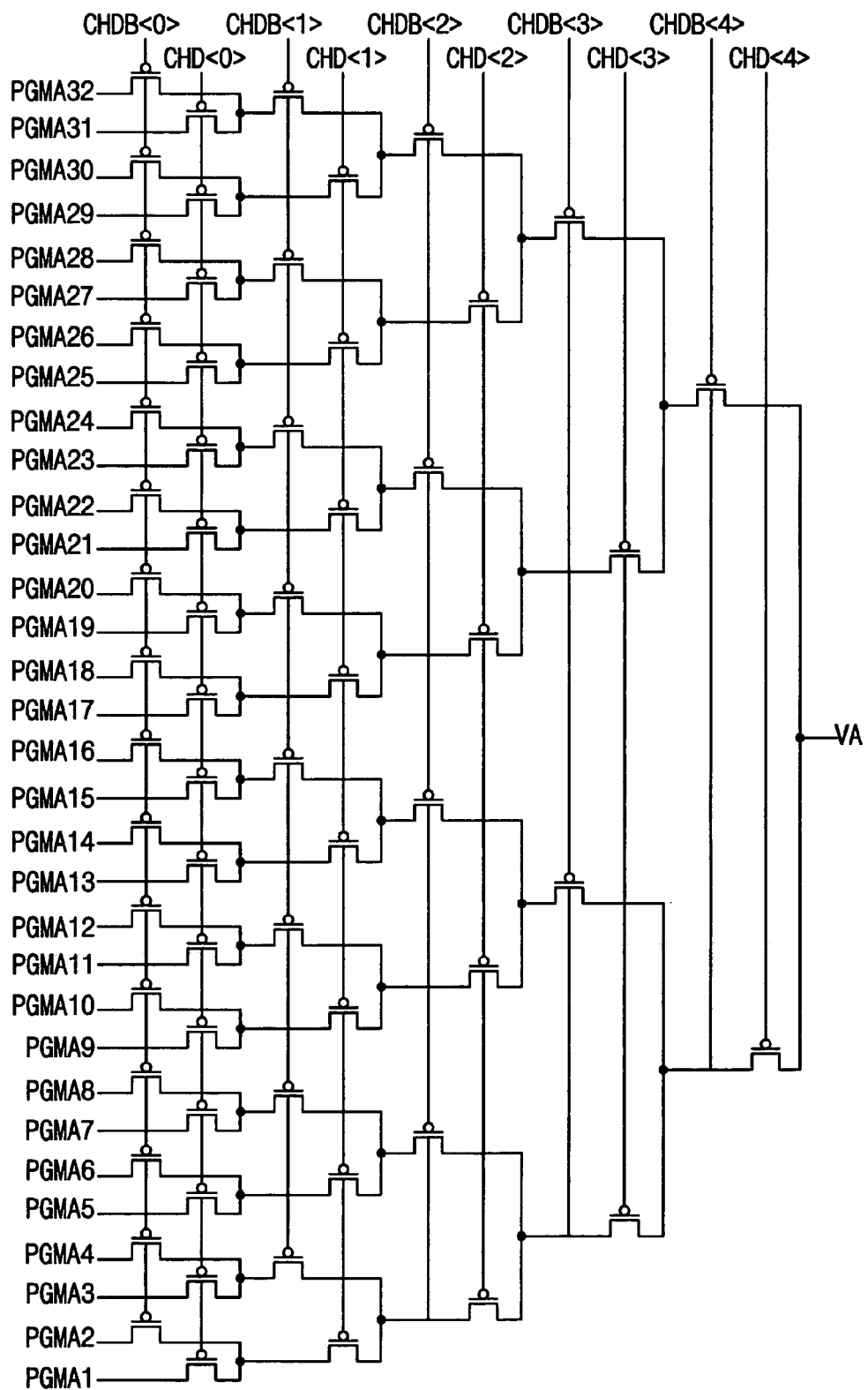
FIG. 8 is a circuit diagram showing the 5-bit decoder of FIG. 5 according to an exemplary embodiment of the present invention.

FIG. 8 is a circuit diagram of the 5-bit decoder of FIG. 5 according to an exemplary embodiment of the present invention. Referring to FIG. 8, the decoder DECP has a binary tree structure. For example, the decoder DECP includes 62 PMOS transistors.

Therefore, returning to FIG. 5, the NLDACP block selects one of the internal gamma reference voltage signals PGMA1 through PGMA32 and PGMA57 through PGMA88 based on a code value, and outputs an analog gray scale signal corresponding to the internal gamma reference voltage signals PGMA1 through PGMA32 and PGMA57 through PGMA88, thereby operating as a resistor string of the DAC 350.

The non-linear multiplexer NLMUXP provides the VA signal to the second DAC block LDACP in response to the HGP and LGP signals.

The second DAC block LDACP includes a low reference voltage decoder VLDECP, a high reference voltage decoder VHDECP and a binary weighted capacitor DAC (CDACP).

The low reference voltage decoder VLDECP selects one among the 24 internal gamma reference voltage signals PGMA33 to PGMA56, corresponding to the middle linear region, to output a low reference voltage signal VL in response to upper five bits CHDi[7:3] of the 8-bit channel data CHDi.

The high reference voltage decoder VHDECP selects one among the 24 internal gamma reference voltage signals PGMA34 to PGMA57 to output a high reference voltage signal VH in response to five bits CHDi[7:3] of the 8-bit channel data CHDi.

Figure 9:
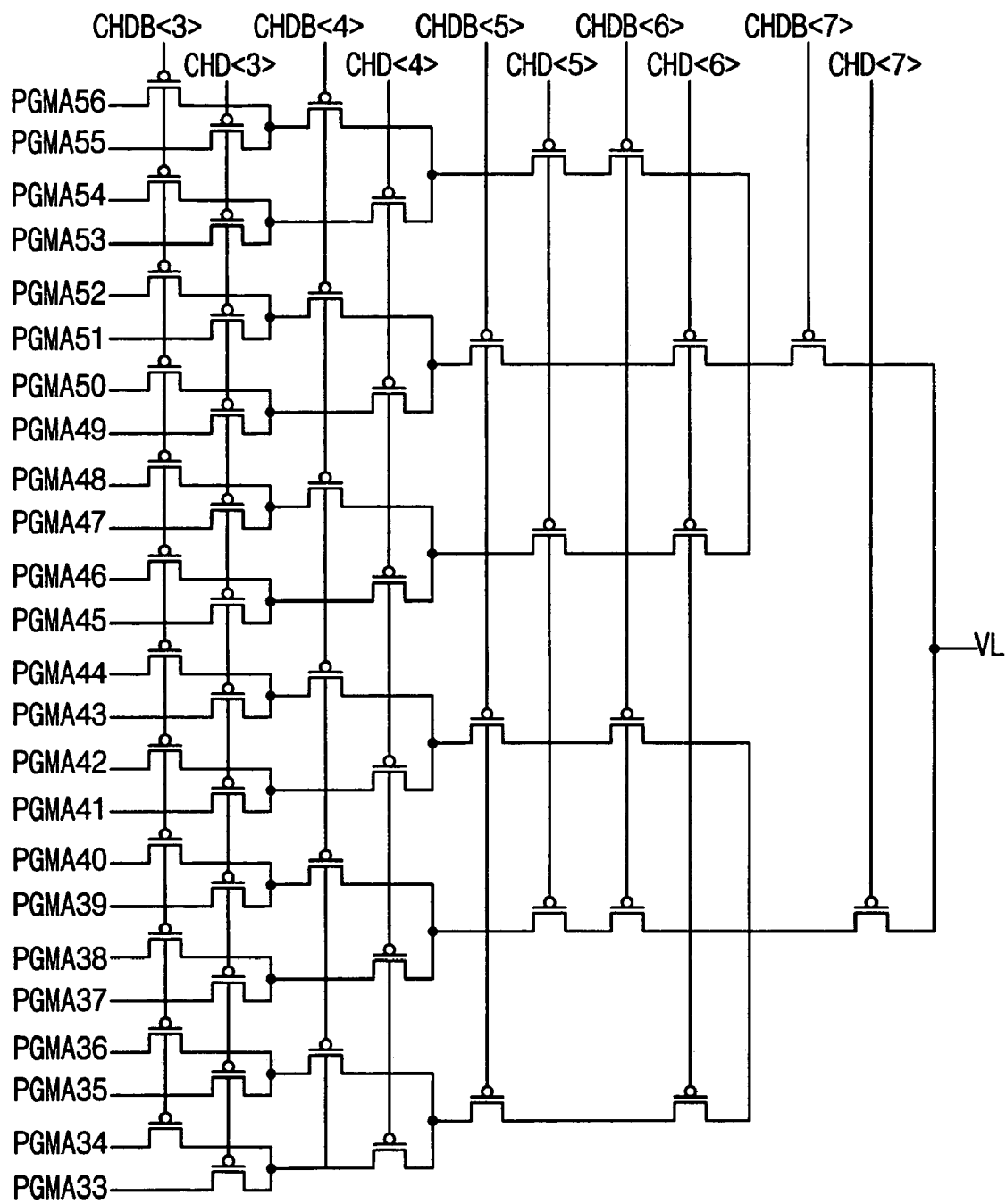
FIG. 9 is a circuit diagram showing the low voltage decoder of FIG. 5 according to an exemplary embodiment of the present invention.

FIG. 9 is a circuit diagram of the low voltage decoder VLDECP of FIG. 5 according to an exemplary embodiment of the present invention.

Referring to FIG. 9, the low and high reference voltage decoders VLDECP and VHDECP respectively have a modified binary tree structure for selecting one among the internal gamma reference voltage signals PGMA33 through PGMA56. For example, the reference voltage decoders VLDECP and VHDECP respectively include 50 PMOS transistors.

Figure 10:
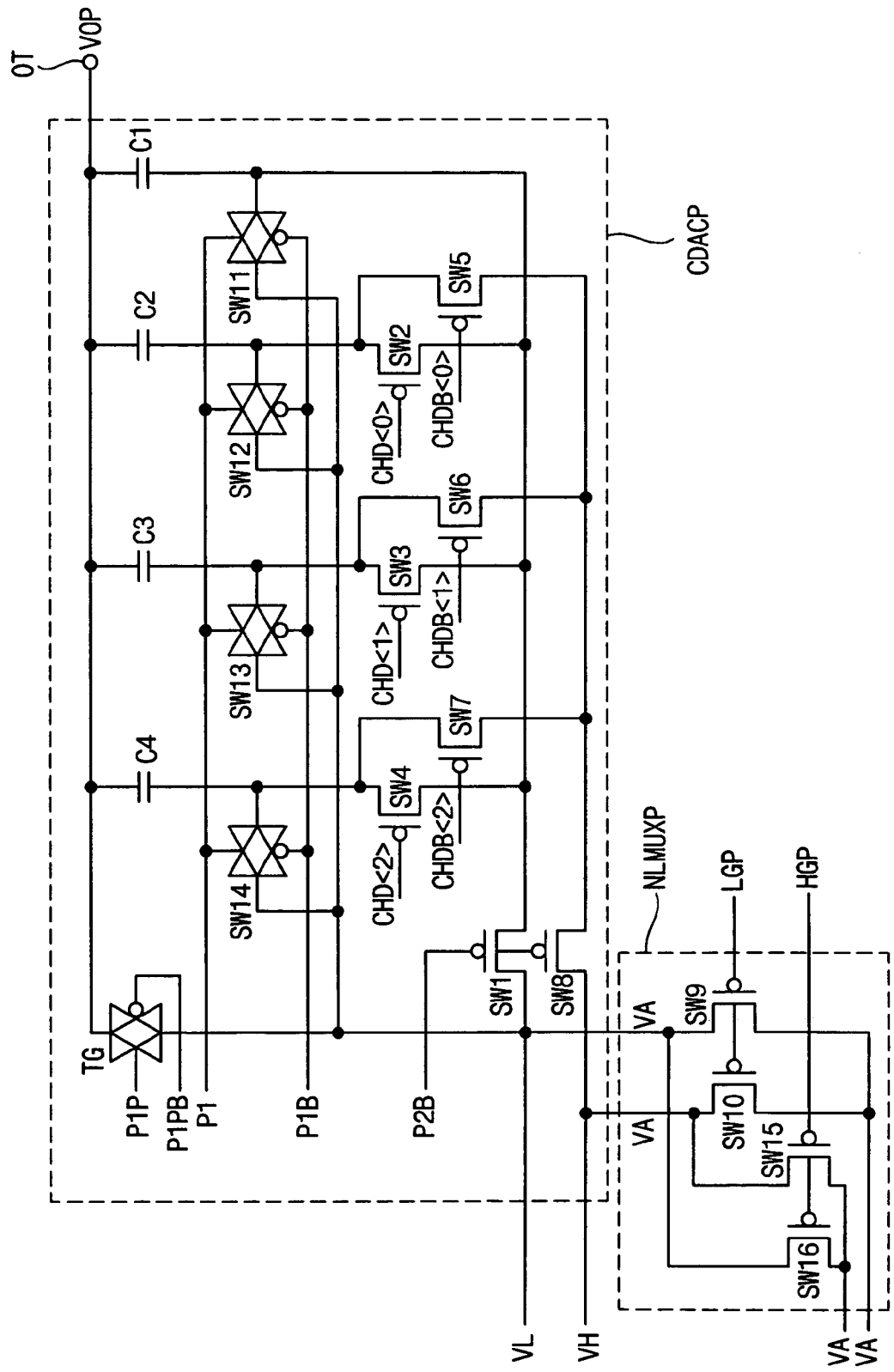
FIG. 10 is a circuit diagram showing the positive capacitor D/A converting unit of FIG. 5 according to an exemplary embodiment of the present invention.

The binary weighted capacitor DAC (CDACP) selects one among voltage signals, which are generated by dividing an interval between voltages of the low reference voltage signal VL and the high reference voltage signal VH into eight voltage levels, in response to the lower three bits CHDi[2:0] of the 8-bit channel data CHDi to output the selected voltage signal as a gray scale signal VOP. FIG. 10 is a circuit diagram showing a positive capacitor D/A converting unit of FIG. 5 according to an exemplary embodiment of the present invention.

Referring to FIG. 10, the non-linear multiplexer NLMUXP receives the VA signal of the decoder DECP to selectively output the VA signal in response to the LGP and HGP signals. Two PMOS transistors SW9 and SW10 respond to the LGP signal and two PMOS transistors SW15, SW16 respond to the HGP signal, thereby switching the VA signal to input terminals of VL and VH signals. Therefore, the VA signal is connected to the binary weighted capacitor DAC (CDACP) only in case of the lower or upper code set.

The binary weighted capacitor DAC (CDACP) may include four capacitors C1, C2, C3 and C4, each of which has binary weights each other. The C1 has the same capacitance as C2, the C3 is equal to twice C1 and the C4 is equal to four times C1.

Each of one ends of the capacitors C1, C2, C3 and C4 is connected in common to an output terminal OT. The opposite end of the C1 is connected to the VL signal via the switching element SW1. Each of the opposite ends of the capacitors C2, C3 and C4 is connected in common to one end of the switching element SW1 via the switching elements SW2, SW3 and SW4, respectively, and the opposite end of the switching element SW1 is connected to the VL signal. In addition, the opposite ends of the capacitors C2, C3 and C4 are connected in common to one end of the switching element SW8 via the switching elements SW5, SW6 and SW7, respectively, and the opposite end of the switching element SW8 is connected to the VH signal. An output voltage VA of the decoder DECP is coupled to the VL signal via a switching element SW9, and coupled to the VH signal via a switching element SW10. The switching element TG is connected between the output terminal OP and the VL signal, and opposite ends of the capacitors C1, C2, C3 and C4 are connected in common to the VL signal via switching elements SW11~SW14 respectively.

The switching elements SW1 through SW8 may include PMOS transistors. The switching elements SW11 through SW14 may include transmission gates.

P1P and P1PB signals are applied to the TG, P1 and P1B signals are applied to the switching elements SW11, through SW14, and P2B signal is applied to gates of the SW1 and SW8. The P1P and P1 signals have the same phase with respect to each other, and are time-delayed signals, in order to reduce Channel Charge Injection Error (CCIE).

A CHD<0> bit is provided to a gate of the SW2, a CHD<1> bit is provided to a gate of the SW3, and a CHD<2> bit is applied to a gate of the SW4. A CHDB<0> is provided to a gate of the SW5, a CHDB<1> bit is provided to a gate of the SW6 and a CHDB<2> bit is provided to a gate of the SW7.

Therefore, an output voltage VOP is obtained based on the code value, wherein the VOP is expressed as the following equation 1.

$$VOP = VL + C_{VH} \times (VH - VL)/2^3 C, \qquad \text{<Equation 1>}$$

wherein $C_{VH}$ represents a total capacitance of capacitors connected to VH signal.

$C_{VH}$ is expressed as the following equation 2.

$$C_{VH} = CHD<2> \times 2^2 C + CHD<1> \times 2^1 C + CHD<0> \times 2^0 C \qquad \text{<Equation 2>}$$

Therefore, voltage division is obtained as shown in table 1 based on 3-bit code CHD[2:0].

TABLE 1

| Code value | SW2/SW5 | SW3/SW6 | SW4/SW7 | VL/VH | VOP |
|---|---|---|---|---|---|
| 000 | ON/OFF | ON/OFF | ON/OFF | 8C/0 | VL |
| 001 | OFF/ON | ON/OFF | ON/OFF | 7C/1C | VL + 1/8(VH-VL) |

TABLE 1-continued

| Code value | SW2/SW5 | SW3/SW6 | SW4/SW7 | VL/VH | VOP |
|---|---|---|---|---|---|
| 010 | ON/OFF | OFF/ON | ON/OFF | 6C/2C | VL + 2/8(VH-VL) |
| 011 | OFF/ON | OFF/ON | ON/OFF | 5C/3C | VL + 3/8(VH-VL) |
| 100 | ON/OFF | ON/OFF | OFF/ON | 4C/4C | VL + 4/8(VH-VL) |
| 101 | OFF/ON | ON/OFF | OFF/ON | 3C/5C | VL + 5/8(VH-VL) |
| 110 | ON/OFF | OFF/ON | OFF/ON | 2C/6C | VL + 6/8(VH-VL) |
| 111 | OFF/ON | OFF/ON | OFF/ON | 1C/7C | VL + 7/8(VH-VL) |

<Negative DAC>

With reference again to FIG. 4, the negative DAC NDAC is similar in structure to the positive DAC PDAC described above except that each of the components, MUXP, NLMUXP, DECP, VLDECP, VHDECP and CDACP of the negative DAC (NDAC) includes NMOS transistors, whereas each of the component MUXP, NLMUXP, DECP, VLDECP, VHDECP and CDACP of the positive DAC (PDAC) includes PMOS transistors. Therefore, hereinafter only differences between the positive DAC PDAC and the negative DAC NDAC are illustrated to avoid a redundancy.

Figure 11:
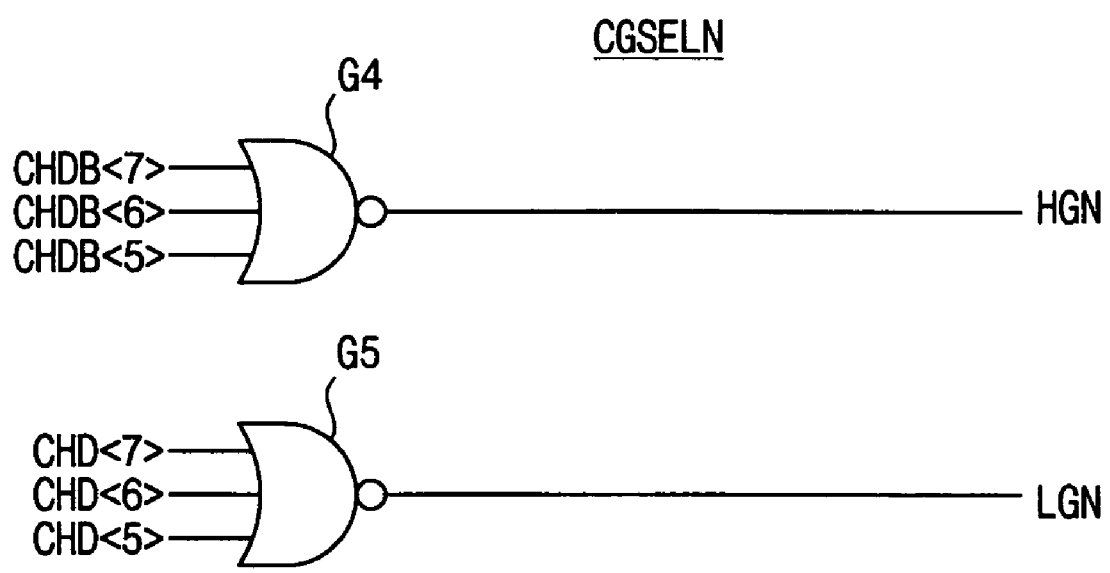
FIG. 11 is a circuit diagram showing the code set selection unit in the negative D/A converter of FIG. 4 according to an exemplary embodiment of the present invention.

An active state is changed from a low state to a high state because each of the components of the negative DAC NDAC has NMOS transistors. Therefore, transistors are activated by a high signal in the negative DAC NDAC, while activated by a low signal in the positive DAC PDAC. FIG. 11 is a circuit diagram showing a code set selection unit in a negative D/A converter of FIG. 4 according to an exemplary embodiment of the present invention.

Referring to FIG. 11, a code set selection unit CHSELN includes a NOR gate G5 for outputting an LGN selection signal having a high state when the upper three bits CHD<7:5> are equal to a binary value "000" and a NOR gate G4 for outputting an HGN selection signal having the high state when the inverted upper three bits CHDB<7:5> are equal to a binary value "111".

Figure 12:
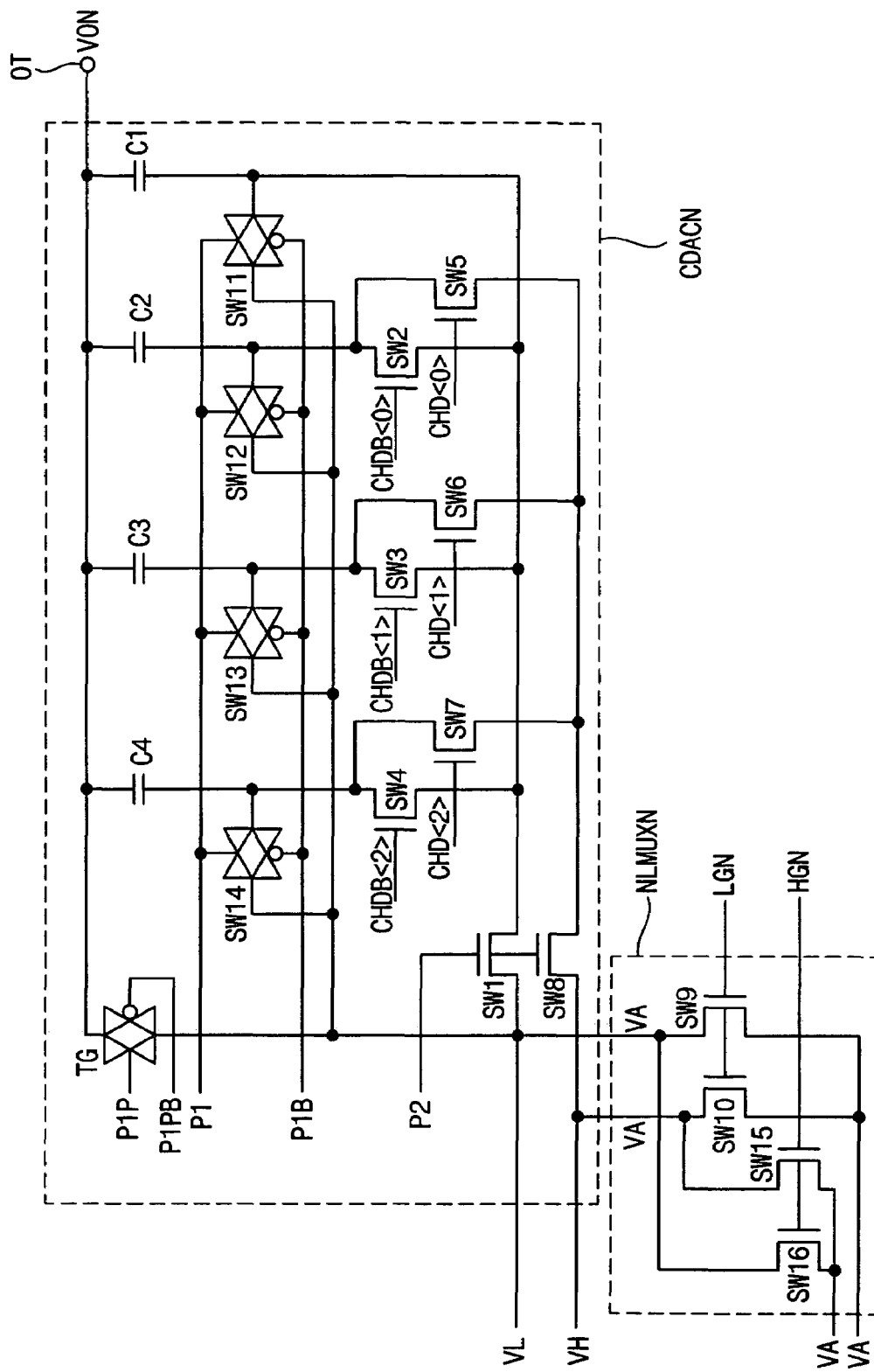
FIG. 12 is a circuit diagram showing the negative capacitor D/A converting unit in the negative D/A converter of FIG. 4 according to an exemplary embodiment of the present invention.

FIG. 12 is a circuit diagram showing a negative capacitor D/A converting unit in a negative D/A converter of FIG. 4 according to an exemplary embodiment of the present invention.

Referring to FIG. 12, the binary weighted capacitor DAC CDACP of FIG. 12 has the same configuration as the binary weighted capacitor DAC CDACP of FIG. 10 except that the P2 signal is applied to the gates of the SW1 and SW8 instead of the P2B signal since the SW1 and SW8 are NMOS transistors instead of PMOS transistors. In addition, CHDB<0>, CHDB<1> and CHDB<2> instead of CHD<0>, CHD<1> and CHD<2> are applied to the gates of the SW2, SW3 and SW4, respectively, and CHD<0>, CHD<1> and CHD<2> instead of CHDB<0>, CHDB<1> and CHDB<2> are applied to gates of the SW5, SW6 and SW7, respectively.

A non-linear multiplexer NLMUXN receives the VA signal of the decoder DECN and selectively outputs the VA signal in response to the LGN and HGN signals. Two NMOS transistors SW9 and SW10 respond to the LGN signal, and other two NMOS transistors SW15 and SW16 respond to the HGN signal, thereby switching the VA signal to the input terminals of VL and VH signals. Therefore, the VA signal is connected to the CDACN only in case of the lower or upper code set.

2. Post-Multiplexing Type

<Post Positive DAC>

Figure 13:
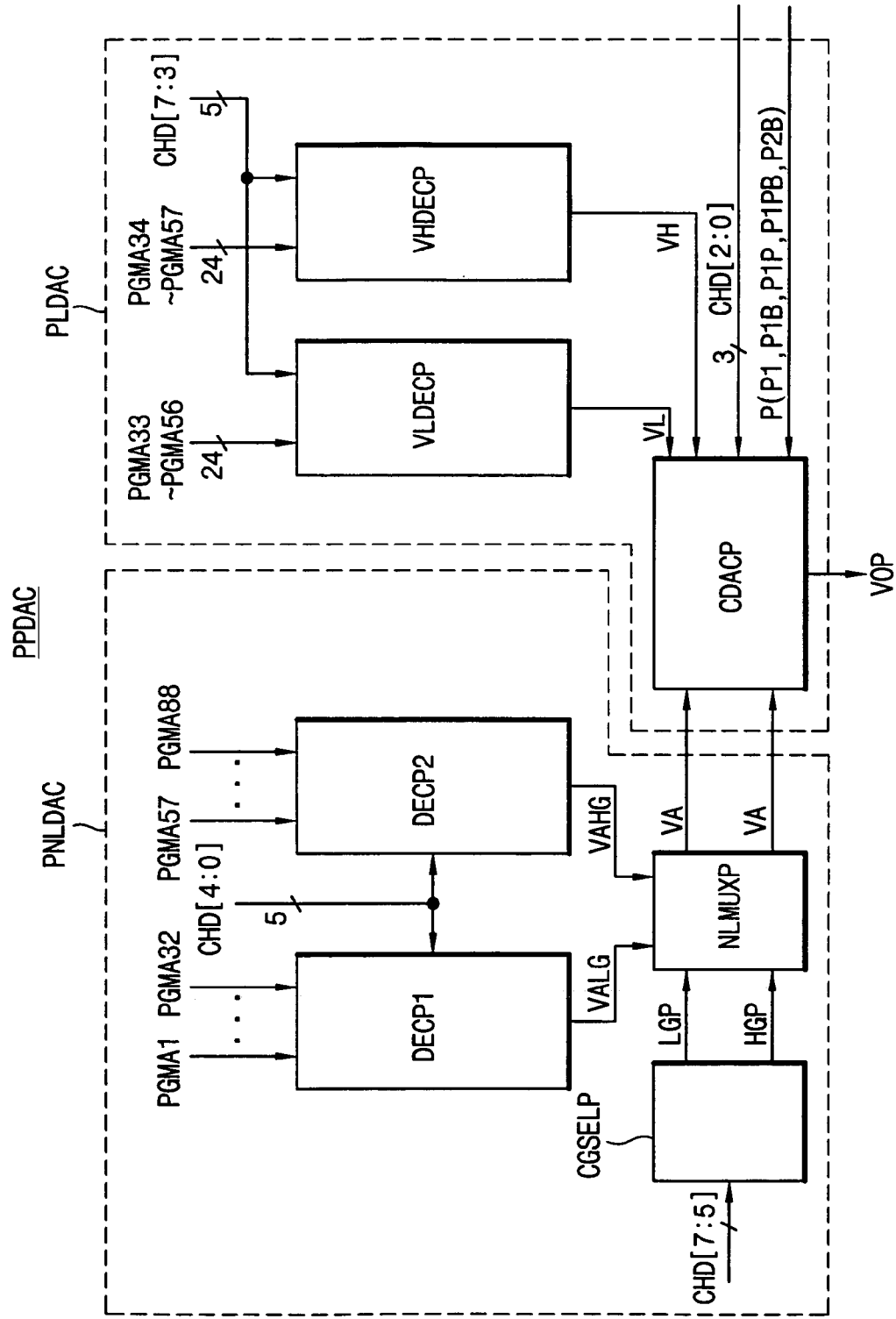
FIG. 13 is a block diagram illustrating the positive D/A converter of FIG. 4 of a post multiplexing type according to another exemplary embodiment of the present invention.

FIG. 13 is a block diagram illustrating a positive D/A converter of FIG. 4 of a post multiplexing type according to another exemplary embodiment of the present invention.

Referring to FIG. 13, the post positive DAC PPDAC includes a first DAC block PNLDAC that corresponds to non-linear regions in both end regions of the gamma correction curve, and a second DAC block PLDAC that corresponds to the linear region in the middle region of the gamma correction curve.

The first DAC block PNLDAC includes a code set selecting unit CGSELP, a non-linear multiplexer NLMUXP and decoders DECP1 and DECP2. The decoders DECP1 and DECP2 decode the gamma reference voltage signals PGMA1 to PGMA32, PGMA57 to PGMA88, and the non-linear multiplexer NLMUXP multiplexes the decoded gamma reference voltage signals.

Here, the decoders DECP1 and DECP2 have structures that are similar to that of the DECP of FIG. 5.

The non-linear multiplexer NLMUXP receives VALG and VAHG signals of the DECP1 and DECP2 and selectively outputs the VALG and VAHG signals in response to the LGN and HGN signals. Accordingly, the VALG signal is connected to the CDACP as a VA signal in case of the lower code set, and the VAHG signal is connected to the CDACP as a VA signal in case of the upper code set. The PLDAC includes a low reference voltage decoder VLDECP, a high reference voltage decoder VHDECP and a binary weighted capacitor DAC CDACP. The VLDEC, VHDEC, CHSELP, DECP1 and DECP2 of FIG. 13 correspond to the VLDEC, VHDEC, CHSELP, DECP of FIG. 5 in the above-mentioned pre-multiplexing type, and are represented by the same reference numerals. Thus, the detailed descriptions thereof will be omitted.

<Post Negative DAC>

As the pre-multiplexing type negative DAC has a different configuration from the pre-multiplexing type positive DAC, the post negative DAC has a different configuration from that of the post positive DAC. Thus, the difference between the post negative DAC and the post positive DAC may be inferred by the difference between the pre-multiplexing type negative DAC and the pre-multiplexing type positive DAC, and the detailed description thereof is omitted.

3. Output Buffer

Referring back to FIG. 4, the output buffer unit 360 multiplexes positive and negative analog signals VOP and VON to corresponding odd numbered source lines and even numbered source lines in response to a mode signal MODE and a polarity control signal POL.

Figure 14:
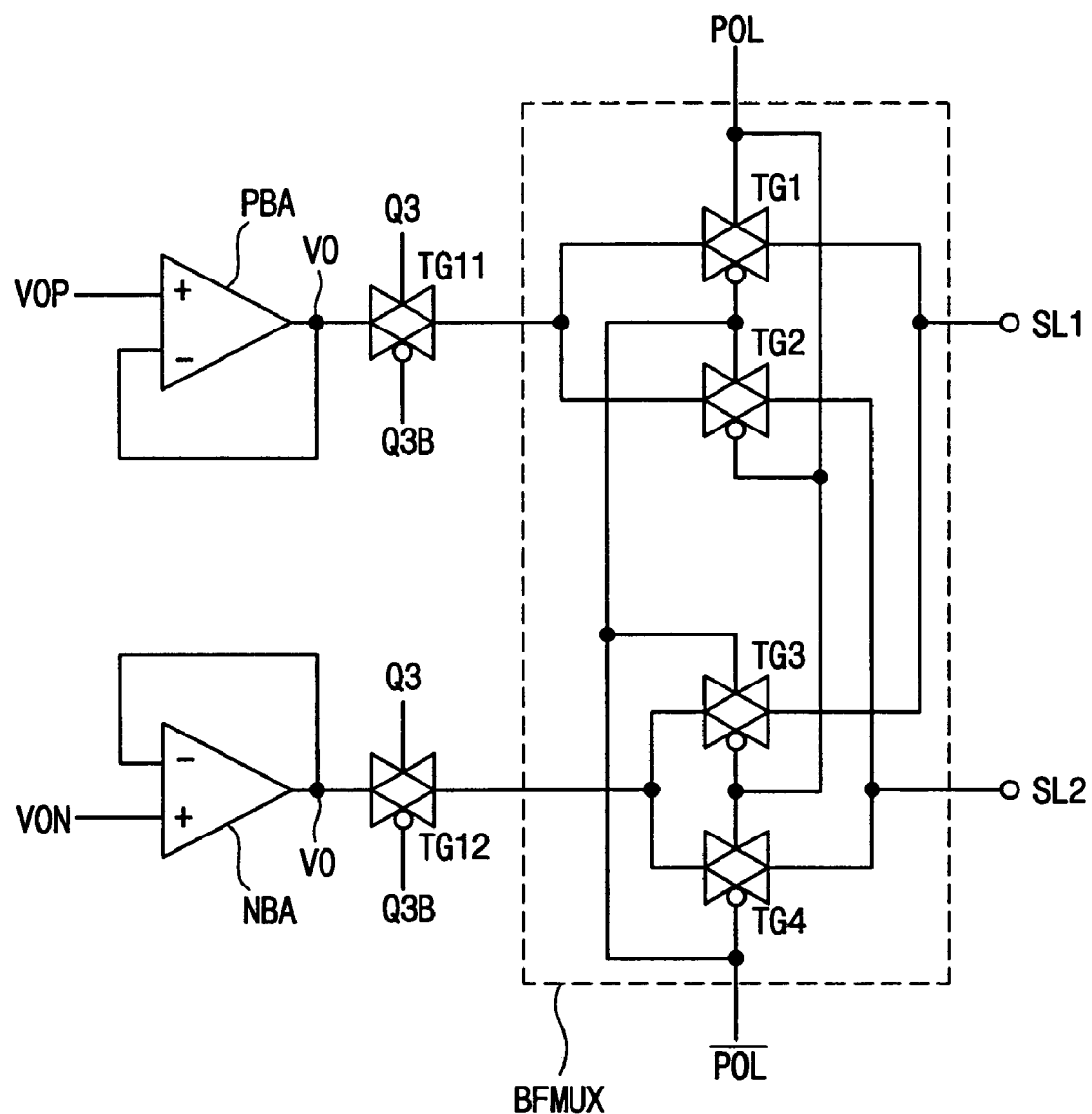
FIG. 14 is a circuit diagram illustrating a two-channel output buffer according to an exemplary embodiment.

FIG. 14 is a circuit diagram illustrating a two-channel output buffer according to an exemplary embodiment of the present invention.

Referring to FIG. 14, odd numbered channels of the output buffer unit 360 include an output buffer amplifier PBA, respectively, and even numbered channels include an output buffer amplifier NBA, respectively.

An output terminal of the PBA is connected to an input terminal at one end of the buffer multiplexer BFMUX via the TG11, and an output terminal of the NBA is connected to an input terminal at the opposite end of the buffer multiplexer BFMUX via the TG12. Outputs of the output buffer amplifiers PBA and NBA are respectively connected to an odd numbered source line SL1 and an even numbered source line SL2 through the buffer multiplexer BFMUX. The respective buffer multiplexers BFMUX include transmission gates TG1 through TG4.

The VOP is applied to a positive input terminal of the output buffer amplifier PBA, and a negative input terminal is connected to an output terminal thereof. In addition, the output terminal of the output buffer amplifier PBA is connected to the SL1 via the TG1 gate and connected to the SL2 via the TG2 gate. The VON is applied to a positive input terminal of the output buffer amplifier NBA, and a negative input terminal is connected to the output terminal thereof. In addition, the output terminal of the output buffer amplifier NBA is connected to the SL1 via the TG3 gate and connected to the SL2 via the TG4 gate.

The POL signal is applied to positive input terminals of the TG1 and TG4 gates, and /POL signal is applied to negative input terminals of the TG1 and TG4 gates and positive input terminals of the TG2 and TG3 gates. Therefore, when the POL signal has a high state, the VOP is output to the SL1, and the VON is output to the SL2. When the POL signal has a low state, the VOP is output to the SL2 and the VON is output to the SL1.

Figure 15:
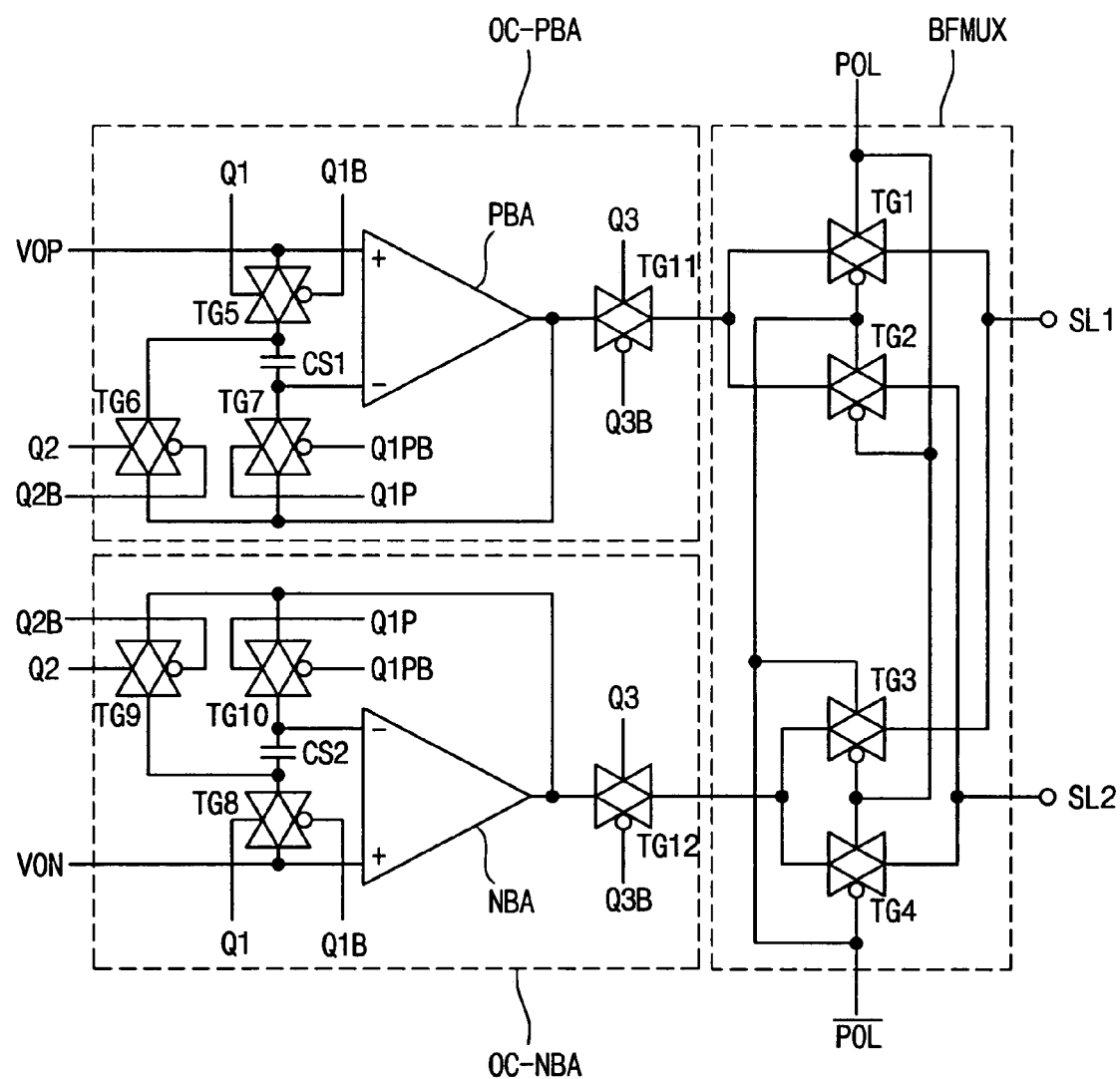
FIG. 15 is a circuit diagram illustrating a two-channel output buffer according to another exemplary embodiment.

FIG. 15 is a circuit diagram illustrating a two-channel output buffer according to another exemplary embodiment of the present invention.

Referring to FIG. 15, a transmission gate TG5 and a sampling capacitor CS1 are serially connected between a positive input terminal and a negative input terminal of an offset removal output buffer amplifier OC-PBA. A TG6 transmission gate is connected between an output terminal and a common junction of the TG5 and the CS1, and a TG7 transmission gate is connected between the negative input terminal and the output terminal. A transmission gate TG8 and a sampling capacitor CS2 are serially connected between a positive input terminal and a negative input terminal of an offset removal output buffer amplifier OC-NBA. A TG9 transmission gate is connected between the output terminal and a common junction of the TG8 gate and the CS2 capacitor, and a TG10 transmission gate is connected between the negative input terminal and the output terminal.

A control clock signal Q1 is applied to positive input terminals of the TG5 and TG8, and a control clock signal Q1B is applied to negative input terminals thereof. A control clock signal Q2 is applied to positive input terminals of the TG6 and TG9, and a control clock signal Q2B is applied to negative input terminals thereof. A control clock signal Q1P is applied to positive input terminals of the TG7 and TG10, and a control clock signal Q1PB is applied to negative input terminals thereof.

Figure 16:
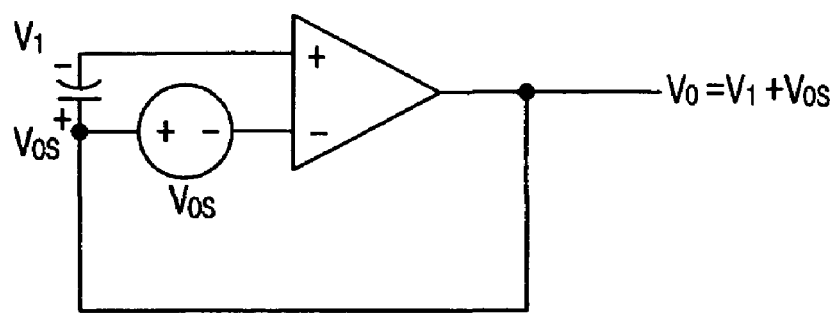
FIGS. 16 and 17 are circuit diagrams illustrating an offset removal operation in the two-channel output buffer of FIG. 15.
Figure 17:
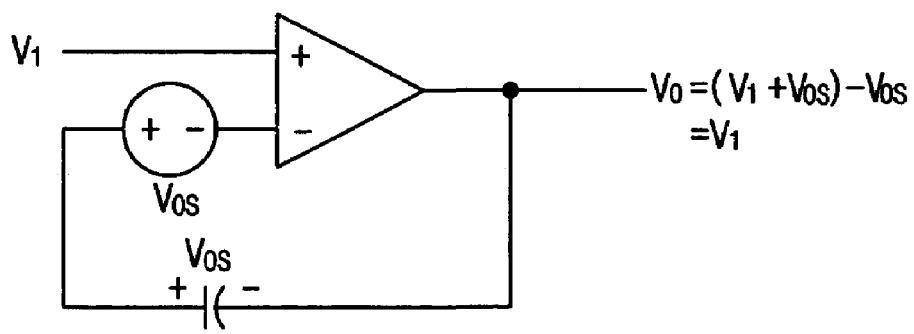

FIGS. 16 and 17 are circuit diagrams that illustrate the offset elimination operation in the two-channel output buffer in FIG. 15.

Referring to FIG. 16, an input offset voltage VOS is sampled by the sampling capacitor CS1 when the TG5 and TG7 of the OC-PBA are turned on and the TG6 is turned off.

Referring to FIG. 17, since an offset voltage of the PBA cancels the sampled input offset voltage VOS when the TG5 and TG7 are turned off and the TG6 is turned on, the offset of the PBA is removed from the VOP and the VOP is output as the VO. Thus, the offset voltage of the NBA is also removed.

Figure 18:
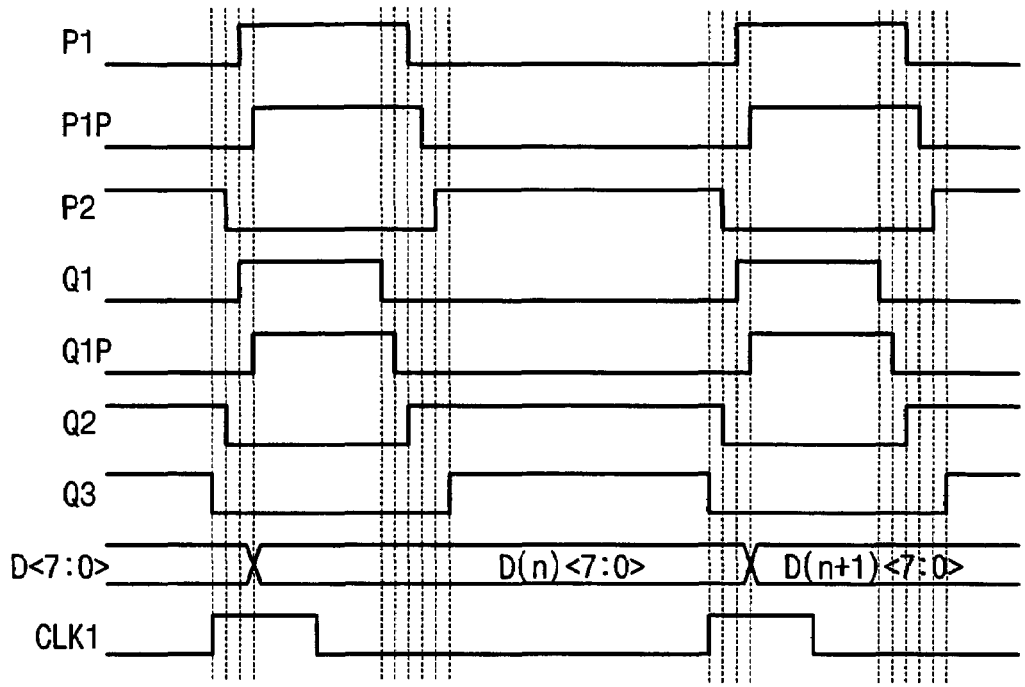
FIG. 18 is a timing diagram illustrating an operation of a D/A converter according to an exemplary embodiment of the present invention.

FIG. 18 is a timing diagram showing an operation of a D/A converter according to an exemplary embodiment of the present invention.

Referring to FIG. 18, the SW1 and SW8 switching elements are turned off at a falling edge of the P2 signal, and the SW11 to SW14 switching elements are turned on at a rising edge of the P1 signal. The TG transmission gate is turned on at a rising edge of the P1P signal. Therefore, the C1 to C4 capacitors are discharged via a discharging closed loop that is formed by the SW11 to SW14 switching elements.

The TG11 transmission gate is turned off at a falling edge of the Q3 signal, thereby interrupting an output of an amplifier. The TG6 transmission gate is turned off at a falling edge of the Q2 signal, the TG5 transmission gate is turned on at a rising edge of the Q1 signal, and the TG7 transmission gate is turned on at a rising edge of the Q1P signal. Therefore, an offset voltage of an amplifier is sampled at the capacitor CS1.

The TG5 transmission gate is turned off at a falling edge of the Q1 signal, and the TG7 transmission gate is turned off at a falling edge of the Q1P signal. The SW11 to SW14 switching elements are turned off at a falling edge of the P1 signal. The TG transmission gate is turned off at a falling edge of the Q2 signal. The TG6 transmission gate is turned on at a rising edge of the Q2 signal so that the offset may be removed. Since the SW1 and SW8 switching elements turn on at a rising edge of the P2 signal, signals input to the CDAC (CDACP or CDACN) are divided into capacitors in response to the lower three bit data signal, thereby a gamma corrected analog signal VOP is transmitted to the amplifier. The VOP signal transmitted to the amplifier is amplified with the offset being eliminated, and output to an output terminal of the PBA. Since the TG11 transmission gate turns on at a rising edge of the Q3 signal, the output signal of the PBA is applied to the SL1 via the buffer multiplexer BFMUX.

The offset is sampled with an output terminal of the amplifier being separated from a source line, which is a load. In this manner, the sampling time period may be constant, and remain independent of the load in an exemplary embodiment of the present invention. However, the charging time for the panel load, that is the source line, is caused to decrease.

Figure 19:
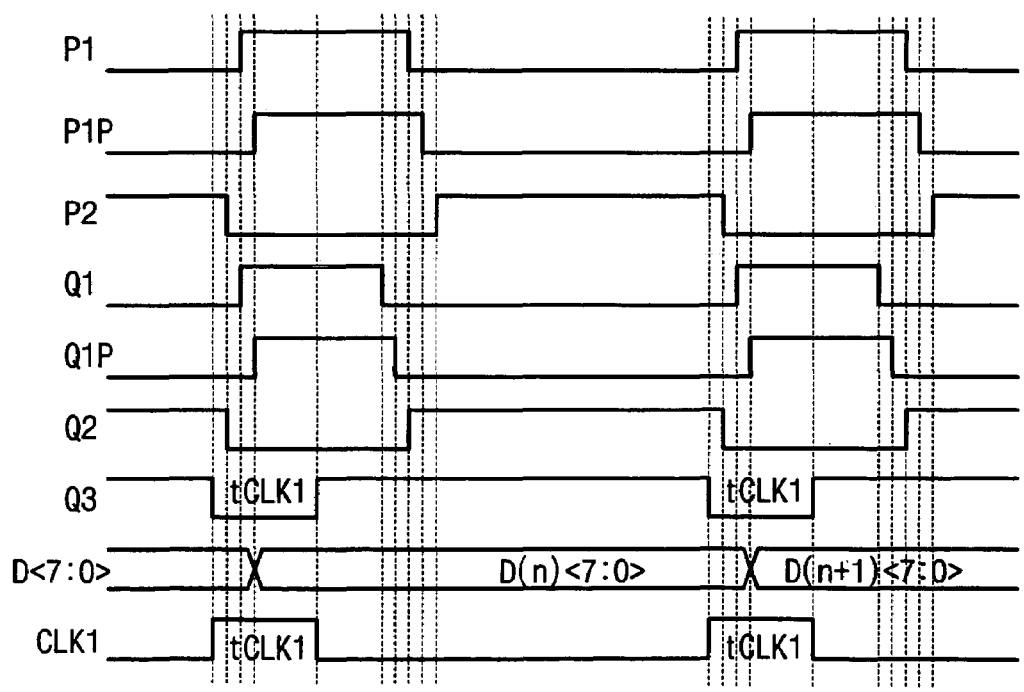
FIG. 19 is a timing diagram illustrating an operation of a D/A converter according to another exemplary embodiment of the present invention.

FIG. 19 is a timing diagram illustrating an operation of a D/A converter according to another exemplary embodiment of the present invention.

The operation in FIG. 19 differs from the operation in FIG. 18 in that the TG11 transmission gate is turned on during the offset sampling time period in response to the Q3 signal, thereby being connected to a source line. Therefore, although the charging time for the panel load is sufficient in the embodiment of FIG. 19, the offset sampling time period needs to be modulated according to the panel load.

As described above, the DAC according to an exemplary embodiment of the present invention may perform an enhanced gamma correction operation, while also reducing the size of the D/A converter.

TABLE 2

|  | Resistor string DAC | Conventional hybrid DAC | Interpolating DAC | Hybrid DAC of the present invention | |
| --- | --- | --- | --- | --- | --- |
|  |  |  |  | Pre-multiplexing DAC | Post multiplexing DAC |
| Architecture | One step | Two step subranging | Two step interpolating | Two step subranging | Two step subranging |
| Used devices | R/CMOS | R/C/CMOS | R/C/CMOS | R/C/CMOS | R/C/CMOS |
| Gamma characteristic | Excellent | Bad | Bad | Good | Good |
| Number of gamma reference voltage lines | 256 | 32 | 32 | 88 | 88 |
| Decoder architecture | 8 bit decoder | Two 5 bit decoders, 3 bit CDAC | Two 5 bit decoders, 3 bit decoder, interpolating network | 5 bit decoder, mux, two 4.5 bit decoders, 3 bit CDAC | Two 5 bit decoders, two 4.5 bit decoders, 3 bit CDAC |
| Size ratio with respect to a resistor string DAC | 1 | $2/8 + \alpha$ | $2/8 + \alpha$ | $4/8 + \alpha$ | $4/8 + \alpha$ |

Table 2 illustrates a comparison between the approach taken by the conventional DAC methods and apparatus and the hybrid approach taken by the method and system of the present invention. The $\alpha$ symbol of table 2 represents a size of the three bit CDAC (CDACP or CDACN).

As shown in table 2, the number of the lines in the hybrid DAC of the present invention is reduced from 256 to 88, reducing to about one third in comparison with the conventional resistor string DAC, and the resulting size of the hybrid DAC of the present invention is reduced to about a half of the resistor string DAC. In addition, although the size of the DAC of the present invention is increased in comparison with the conventional hybrid DAC or the interpolating DAC, the gamma characteristic is enhanced.

Having described the exemplary embodiments of the present invention and its advantages, it is noted that various changes, substitutions and alterations can be made herein without departing from the spirit and scope of the invention as defined by appended claims.

For example, 3-to-8 CDAC may be changed into 4-to-16 CDAC or 5-to-32 CDAC in a 9-bit or 10-bit GC-DAC with a decreased number of the middle gamma correction reference voltage signal lines.

What is claimed is:

1. A gamma correction digital-to-analog converter comprising:

a first digital-to-analog conversion circuit configured to select one from a plurality of first gamma correction reference voltage signals as a first corresponding gray scale signal based on lower m+n bits of a k bit digital input signal when upper l bits of the k bit digital input signal correspond to an upper or lower code set, wherein k is equal to l+m+n, and k, l, m and n are integers;

a second digital-to-analog conversion circuit configured to select a pair of adjacent second gamma correction reference voltage signals from a plurality of second gamma correction reference voltage signals based on upper l+m bits when the upper l bits correspond to a middle code set, and configured to select one from the pair of second gamma correction reference voltage signals and $2^n-1$ divided signals as a second corresponding gray scale signal, the divided signals being obtained by dividing an interval between the selected pair of second gamma correction reference voltage signals into $2^n$ levels; and an output selection circuit configured to select one from the selected first and second gray scale signals to be output.

2. A gamma correction digital-to-analog converter comprising:

a first digital-to-analog conversion circuit configured to select one from $2 \times 2^{m+n}$ upper and lower gamma correction reference voltage signals based on lower m+n bits of a k bit digital input signal as a first corresponding gray scale signal, when the upper l bits of the k bit digital input signal correspond to an upper or lower code set, wherein k is equal to l+m+n, and l, m and n are integers; and a second digital-to-analog conversion circuit configured to select a pair of adjacent second gamma correction reference voltage signals from $1+[\{2^k-(2 \times 2^{m+n})\}/2^n]$ middle gamma correction reference voltage signals based on upper l+m bits when the upper l bits correspond to a middle code set, configured to select one from the selected pair of second gamma correction reference voltage signals and $2^n-1$ divided signals to output as a second corresponding gray scale signal, the $2^n-1$ divided signals being obtained by dividing an interval between the selected pair of second gamma correction reference voltage signals into $2^n$ levels, and configured to output the first corresponding gray scale signal that is selected by the first digital-to-analog conversion circuit when the upper l bits correspond to the upper or lower code set.

3. The digital-to-analog converter of claim 2, wherein the upper and lower code sets correspond to a non-linear region of a gamma correction curve, and wherein the middle code set corresponds to a middle region of the gamma correction curve.

4. The digital-to-analog converter of claim 3, wherein the $2^{m+n} \times 2$ upper and lower gamma correction reference voltage signals have different variation in order to follow linear characteristics of the non-linear region of the gamma correction curve.

5. The digital-to-analog converter of claim 3, wherein $1+[\{2^k-(2 \times 2^{m+n})\}/2^n]$ middle gamma correction reference voltage signals have a similar variation in order to optimize the linear region of the gamma correction curve.

6. The digital-to-analog converter of claim 2, wherein the first digital-to-analog conversion circuit includes:
   a code set selection circuit configured to generate upper and lower code set selection signals based on upper l bits of the k bit digital input signal;
   a reference voltage selection circuit configured to select one from the $2^{m+n}$ lower gamma correction reference voltage signals and the $2^{m+n}$ upper gamma correction reference voltage signals in response to the upper and lower code set selection signals; and
   a m+n bit decoder configured to select one from the selected $2^{m+n}$ gamma correction reference voltage signals to output as the first corresponding gray scale signal based on lower m+n bits of k bit digital input signal.

7. The digital-to-analog converter of claim 6, wherein the m+n bit decoder has a binary tree structure.

8. The digital-to-analog converter of claim 2, wherein the second digital-to-analog conversion unit includes:
   a first reference voltage decoder configured to select one from the $[\{2^k-(2 \times 2^{m+n})\}/2^n]$ middle gamma correction reference voltage signals except a maximum value of the $1+[\{2^k-(2 \times 2^{m+n})\}/2^n]$ middle gamma correction reference voltage signals as a first reference voltage based on upper l+m bits of the k bit digital input signal;
   a second reference voltage decoder configured to select one from the $[\{2^k-(2 \times 2^{m+n})\}/2^n]$ middle gamma correction reference voltage signals except a minimum value of the $1+[\{2^k-(2 \times 2^{m+n})\}/2^n]$ middle gamma correction reference voltage signals as a second reference voltage based on upper l+m bits of the k bit digital input signal; and
   a capacitor digital-to-analog conversion circuit configured to select one from the first and second reference voltages and $2^n-1$ divided signals obtained by dividing an interval between the selected first and second reference voltages by $2^n$ as the second corresponding gray scale signal.

9. The digital-to-analog converter of claim 8, wherein the first and second reference voltage decoders have modified binary tree structures, respectively.

10. The digital-to-analog converter of claim 8, wherein the capacitor digital-to-analog, conversion unit includes:
    a reference capacitor, a first end of which is coupled to an output terminal, and the reference capacitor having a reference capacitance value;
    an array of n capacitors, first ends of which are commonly coupled to the output terminal, the n capacitors corresponding to binary weighted capacitors of the reference capacitor;
    an input selection circuit that receives the first and second reference voltage signals at a first and second nodes respectively when the upper l bits of the k bit digital input signal correspond to the middle code set, and that receives the second gray scale signal selected by the first digital-to-analog conversion circuit at the first and second nodes when the upper l bits of the k bit digital input signal correspond to an upper or a lower code set; and
    a switching circuit configured to switch second ends of the capacitor array and the reference capacitor to be coupled to the first node or the second node in response to lower n bits of the k bit digital input signal.

11. The digital-to-analog converter of claim 10, wherein the capacitor digital-to-analog conversion circuit further includes a discharging circuit configured to couple the second ends of the capacitor array and the reference capacitor to the first node in response to a control clock signal and configured to couple the output terminal to the first node so as to discharge the capacitor arrays before the first reference voltage signal, the second reference voltage signal or the second gray scale signal is input to the input selection circuit.

12. The digital-to-analog converter of claim 2, wherein the first digital-to-analog conversion circuit includes:
    a first m+n bit decoder configured to select one from the $2^{m+n}$ lower gamma correction reference voltage signals based on lower m+n bits of the k bit digital input signal;
    a second m+n bit decoder configured to select one from the $2^{m+n}$ upper gamma correction reference voltage signals based on lower m+n bits of k bit digital input signal;
    a code set selection circuit configured to generate upper and lower code set selection signals in response to upper l bits of the k bit digital input signal; and
    a selector configured to select one from the selected reference voltage signals of the first and second m+n decoders in response to the upper and lower code set selection signals.

13. The digital-to-analog converter of claim 12, wherein the first and second m+n decoders have binary tree structures, respectively.

14. A gamma correction digital-to-analog converting method comprising:
    discriminating whether upper l bits of a k bit digital input signal correspond to an upper code set or a lower code set, wherein k is equal to l+m+n, and l, m and n are integers;
    selecting one from $2 \times 2^{m+n}$ upper and lower gamma correction reference voltage signals based on lower m+n bits of the k bit digital input signal as a first corresponding gray scale signal when the upper l bits correspond to the upper or lower code set;
    selecting a pair of adjacent second gamma correction reference voltage signals from $1+[\{2^k-(2 \times 2^{m+n})\}/2^n]$ middle gamma correction reference voltage signals based on upper l+n bits when the upper l bits correspond to a middle code set;
    selecting one as a second corresponding gray scale signal from the pair of second gamma correction reference voltage signals and $2^n-1$ divided signals obtained by dividing an interval between the pair of second gamma correction reference voltage signals into $2^n$ levels; and
    selectively outputting the selected first or second gray scale signal.

15. The method of claim 14, wherein the upper and lower code sets correspond to a non-linear region of a gamma correction curve, and wherein the middle code set corresponds to a middle region of the gamma correction curve.

16. The method of claim 14, wherein the $2^{m+n} \times 2$ upper and lower gamma correction reference voltage signals have different variation in order to optimize the non-linear region of the gamma correction curve.

17. The method of claim 14, wherein the $1+[\{2^k-(2\times2^{m+n})\}/2^n]$ middle gamma correction reference voltage signals have a similar variation in order to optimize the linear region of the gamma correction curve.

18. The method of claim 14, wherein said selecting one from $2\times2^{m+n}$ upper and lower gamma correction reference voltage signals comprising:
   generating upper and lower code set selection signals based on upper l bits of the k bit digital input signal;
   selecting one from the $2^{m+n}$ lower gamma correction reference voltage signals and the $2^{m+n}$ upper gamma correction reference voltage signals in response to the upper and lower code set selection signals; and
   selecting one from the selected $2^{m+n}$ gamma correction reference voltage signals to output as the first corresponding gray scale signal based on the lower m+n bits of the k bit digital input signal.

19. The method of claim 14, wherein said selecting a pair of adjacent second gamma correction reference voltage signals comprising:
   selecting one from the $[\{2^k-(2\times2^{m+n})\}/2^n]$ middle gamma correction reference voltage signals except a maximum value of the $1+[\{2^k-(2\times2^{m+n})\}/2^n]$ middle gamma correction reference voltage signals as a first reference voltage based on upper l+m bits of the k bit digital input signal;
   selecting one from the $[\{2^k-(2\times2^{m+n})\}/2^n]$ middle gamma correction reference voltage signals except a minimum value of the $1+[\{2^k-(2\times2^{m+n})\}/2^n]$ middle gamma correction reference voltage signals as a second reference voltage based on upper l+m bits of the k bit digital input signal; and
   selecting one from the first and second reference voltages and pair of second gamma correction reference voltage signals and $2^n-1$ divided signals obtained by dividing an interval between the selected first and second reference voltages by $2^n$ as the second corresponding gray scale signal.

20. The method of claim 14, wherein the selecting one from $2\times2^{m+n}$ upper and lower gamma correction reference voltage signals comprising:
   selecting one from the $2^{m+n}$ lower gamma correction reference voltage signals based on lower m+n bits of the k bit digital input signal;
   selecting one from the $2^{m+n}$ upper gamma correction reference voltage signals based on lower m+n bits of k bit digital input signal;
   generating upper and lower code set selection signals in response to upper l bits of the k bit digital input signal; and
   selecting one from the selected reference voltage signals of the first and second m+n decoders in response to the upper and lower code set selection signals.

21. A source driver integrated circuit comprising:
   an input circuit configured to receive a k-bit digital data stream (being) synchronized with a pixel clock, and configured to parallel output p k-bit digital data or parallel output odd numbered k bit digital data and even numbered k bit digital data alternately in response to a polarity control signal, wherein k is equal to l+m+n, and p, k, l, m and n are integers;
   a p-channel gamma correction digital-to-analog converter configured to respectively generate a corresponding positive gray scale signal among $2^k$ gray scale values in odd numbered channels and to generate a corresponding negative gray scale signal among $2^k$ gray scale values in even numbered channels based on the parallel output k-bit data, wherein each of the positive and negative gray scale signals is selected from a plurality of first gamma correction reference voltage signals corresponding to lower m+n bits of the k-bit digital data when the k-bit digital data corresponds to an upper or a lower code set, and each of the positive and negative gray scale signals is selected from a pair of adjacent second gamma correction reference voltage signals or from $2^n-1$ divided signals obtained by dividing an interval between the pair of second gamma correction reference voltage signals by $2^n$ based on upper l+m bits when the k-bit digital data corresponds to a middle code set; and a p channel output buffer configured to output the positive or negative gray scale signal in response to the polarity control signal.

22. The source driver integrated circuit of claim 21, wherein the output buffer includes:
   p/2 first buffer amplifiers for buffering the positive gray scale signal in response to odd numbered channels of the p channels;
   p/2 second buffer amplifiers for buffering the negative gray scale signal in response to even numbered channels of the p channels; and
   p/2 multiplexers for outputting corresponding output signals of the first buffer amplifier and the second buffer amplifier to corresponding odd numbered source lines and even numbered source lines in response to the polarity control signal.

23. The source driver integrated circuit of claim 22, wherein each of the first and second buffer amplifiers is an input offset removal amplifier, respectively.

24. The source driver integrated circuit of claim 23, wherein the input offset removal amplifier includes:
   an operational amplifier having a positive input terminal to which a gray scale signal is applied;
   a capacitor, a first end of which is coupled to a negative input terminal of the operational amplifier;
   a first switch coupled between the positive input terminal and a second end of the capacitor, the first switch being turned on during an offset sampling time period;
   a second switch coupled between the negative input terminal and an output terminal of the operational amplifier, the second switch being turned on during the offset sampling time period;
   a third switch coupled between the output terminal of the operational amplifier and the second end of the capacitor, the third switch being turned off during the offset sampling time period and turned on during a time when the positive or negative gray scale signals are output; and
   a fourth switch coupled between the output terminal of the operational amplifier and corresponding multiplexer.

25. The source driver integrated circuit of claim 24, wherein the fourth switch intercepts a connection between the output terminal of the amplifier and a source line during the offset sample time period and connects the output terminal of the amplifier to the source line during a time when the positive or negative gray scale signals are output.

26. The source driver integrated circuit of claim 24, wherein the fourth switch connects the output terminal of the amplifier to a source line in midterm of the offset sampling time period.

27. A display device comprising:
   a display cell array having a plurality of display cells formed on a region defined by a plurality of source lines and a plurality of gate lines;

a scan driver configured to scan the gate lines in sequence; and a source driver configured to provide the source lines with corresponding gray scale signals, wherein the source driver includes at least one source drive integrated circuit, and each of the source driver integrating circuits comprising:

an input unit configured to receive a k bit digital data stream that is synchronized with a pixel clock and configured to output p number of k bit digital data in response to a polarity control signal in parallel or alternately output odd numbered k bit digital data and even numbered k bit digital data in parallel;

a p-channel gamma correction digital-to-analog converter configured to generate a corresponding positive gray scale signal among $2^k$ gray scale values in odd numbered channels and generate a corresponding negative gray scale signal among $2^k$ gray scale values in even numbered channels based on the parallel data, wherein each of the gray scale signals is one of a plurality of first gamma correction reference voltage signals based on lower m+n bits of the k bit digital input signal when the k bit digital input signal corresponds to upper or lower code set, and each of the gray scale signals is one of a pair of adjacent second gamma correction reference voltage signals selected from a plurality of second middle gamma correction reference voltage signals and $2^n-1$ divided signals obtained by dividing an interval of voltages the pair of second gamma correction reference voltage signals by $2^n$, based on upper l+m bits when the upper l bits correspond to a middle code set; and a p channel output buffer configured to output the positive or negative gray scale signals of the respective channel in response to the polar control signal or alternately output the odd numbered k bit digital data and even numbered k bit digital data.

28. A digital-to-analog converter for converting k bit digital data into a gamma corrected analog signal, the digital-to-analog converter comprising:

a first digital-to-analog conversion circuit configured to convert one of a plurality of first gamma correction reference voltage signals into a first gamma corrected analog signal based on a corresponding code value when an output voltage of the converter and a pixel voltage have a non-linear relationship, the first gamma correction reference voltage signals being finely divided so as to follow non-linear characteristics;

a second digital-to-analog conversion circuit configured to select a pair of adjacent second gamma correction reference voltage signals from a plurality of second gamma correction reference voltage signals to divide an interval between the selected pair of adjacent second gamma correction reference voltage signals based on a corresponding code value and configured to convert the divided signal into a second gamma corrected analog signal when the output voltage of the DAC and the pixel voltage have a linear relationship, the second gamma correction reference voltage signals equally dividing the linear region.

* * * * *